(12) United States Patent
Taniguchi et al.

(10) Patent No.: US 8,384,080 B2
(45) Date of Patent: Feb. 26, 2013

(54) THIN FILM TRANSISTOR, DISPLAY DEVICE, AND ELECTRONIC DEVICE

(75) Inventors: Satoshi Taniguchi, Kanagawa (JP); Mikihiro Yokozeki, Kanagawa (JP); Hiroko Miyashita, Kanagawa (JP); Toshi-kazu Suzuki, Ishikawa (JP)

(73) Assignee: Sony Corporation, Tokyo (JP)

( * ) Notice: Subject to any disclaimer, the term of this patent is extended or adjusted under 35 U.S.C. 154(b) by 119 days.

(21) Appl. No.: 12/964,852

(22) Filed: Dec. 10, 2010

(65) Prior Publication Data
US 2012/0119205 A1 May 17, 2012

(30) Foreign Application Priority Data
Dec. 28, 2009 (JP) .................. 2009-298103

(51) Int. Cl.
*H01L 29/786* (2006.01)
(52) U.S. Cl. ............... 257/43; 257/57; 257/59; 257/63; 257/E29.273; 438/30; 438/149; 438/478
(58) Field of Classification Search ............ 257/43, 257/59, E29.273, 57, 63; 438/30, 149, 478
See application file for complete search history.

(56) References Cited

U.S. PATENT DOCUMENTS

| 5,679,965 | A | * | 10/1997 | Schetzina | 257/103 |
| 5,686,734 | A | * | 11/1997 | Hamakawa et al. | 257/16 |
| 6,350,993 | B1 | * | 2/2002 | Chu et al. | 257/19 |
| 6,600,524 | B1 | * | 7/2003 | Ando et al. | 349/43 |
| 8,030,663 | B2 | * | 10/2011 | Yamazaki et al. | 257/78 |

FOREIGN PATENT DOCUMENTS
JP   2007-281406   10/2007

* cited by examiner

*Primary Examiner* — Thinh T Nguyen
(74) *Attorney, Agent, or Firm* — SNR Denton US LLP

(57) ABSTRACT

A thin film transistor, which is capable of improving carrier mobility, and a display device and an electronic device, each of which uses the thin film transistor, are provided. The thin film transistor includes: a gate electrode; an oxide semiconductor layer including a multilayer film including a carrier travel layer configuring a channel and a carrier supply layer for supplying carriers to the carrier travel layer; a gate insulating film provided between the gate electrode and the oxide semiconductor layer; and a pair of electrodes as a source and a drain. A conduction band minimum level or a valence band maximum level corresponding to a carrier supply source of the carrier supply layer is higher in energy than a conduction band minimum level or a valence band maximum level corresponding to a carrier supply destination of the carrier travel layer.

17 Claims, 21 Drawing Sheets

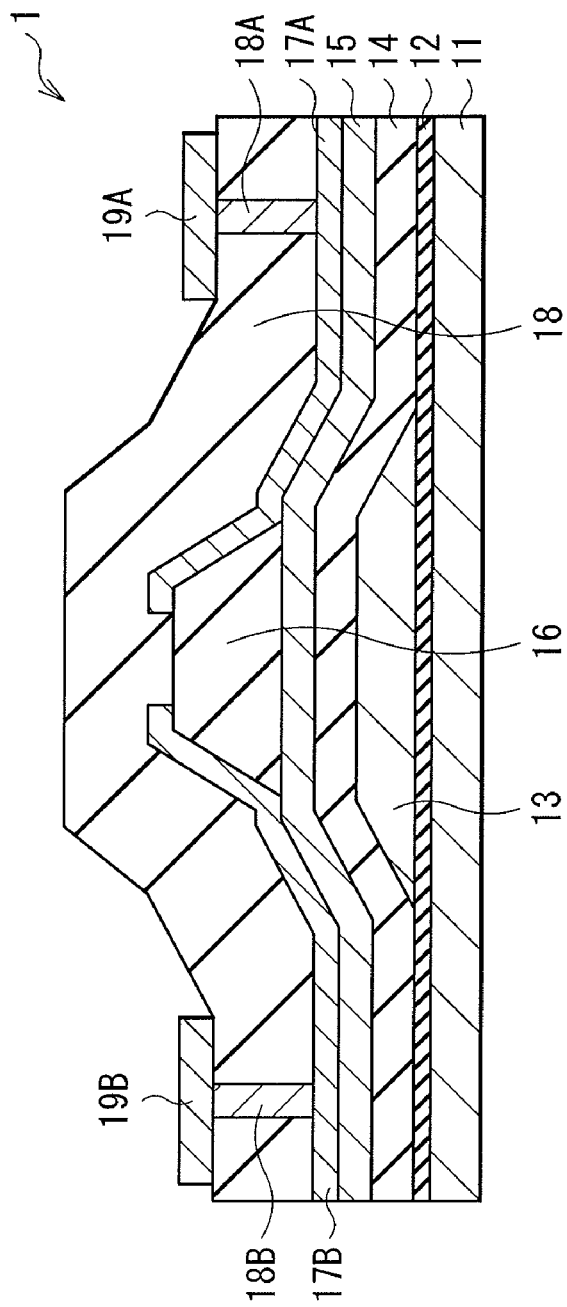
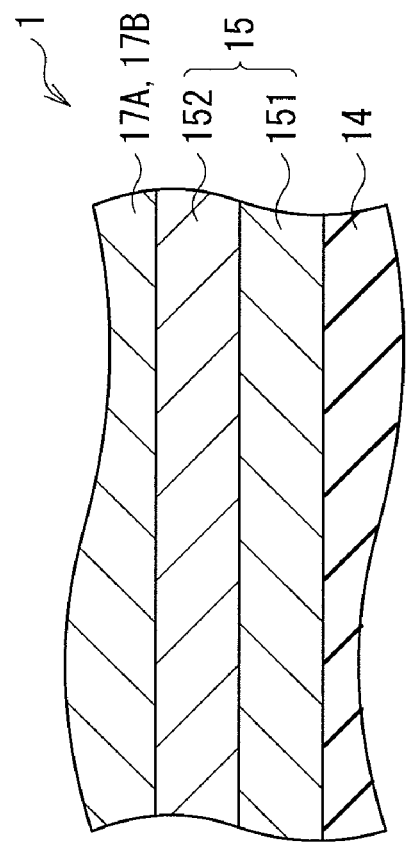
FIG. 1A
FIG. 1B

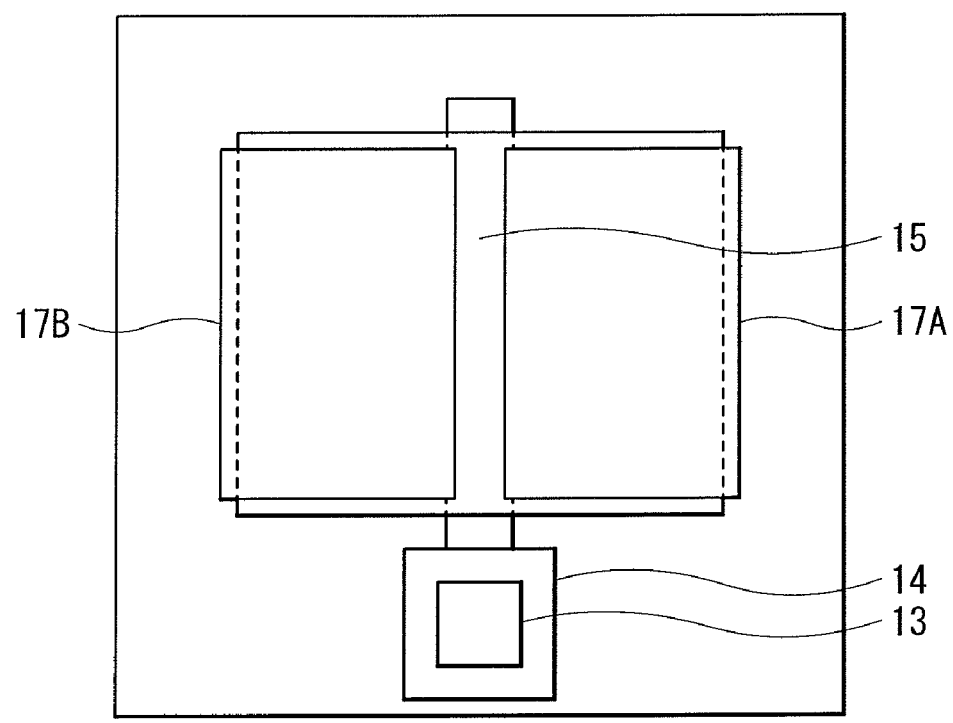
F I G. 5

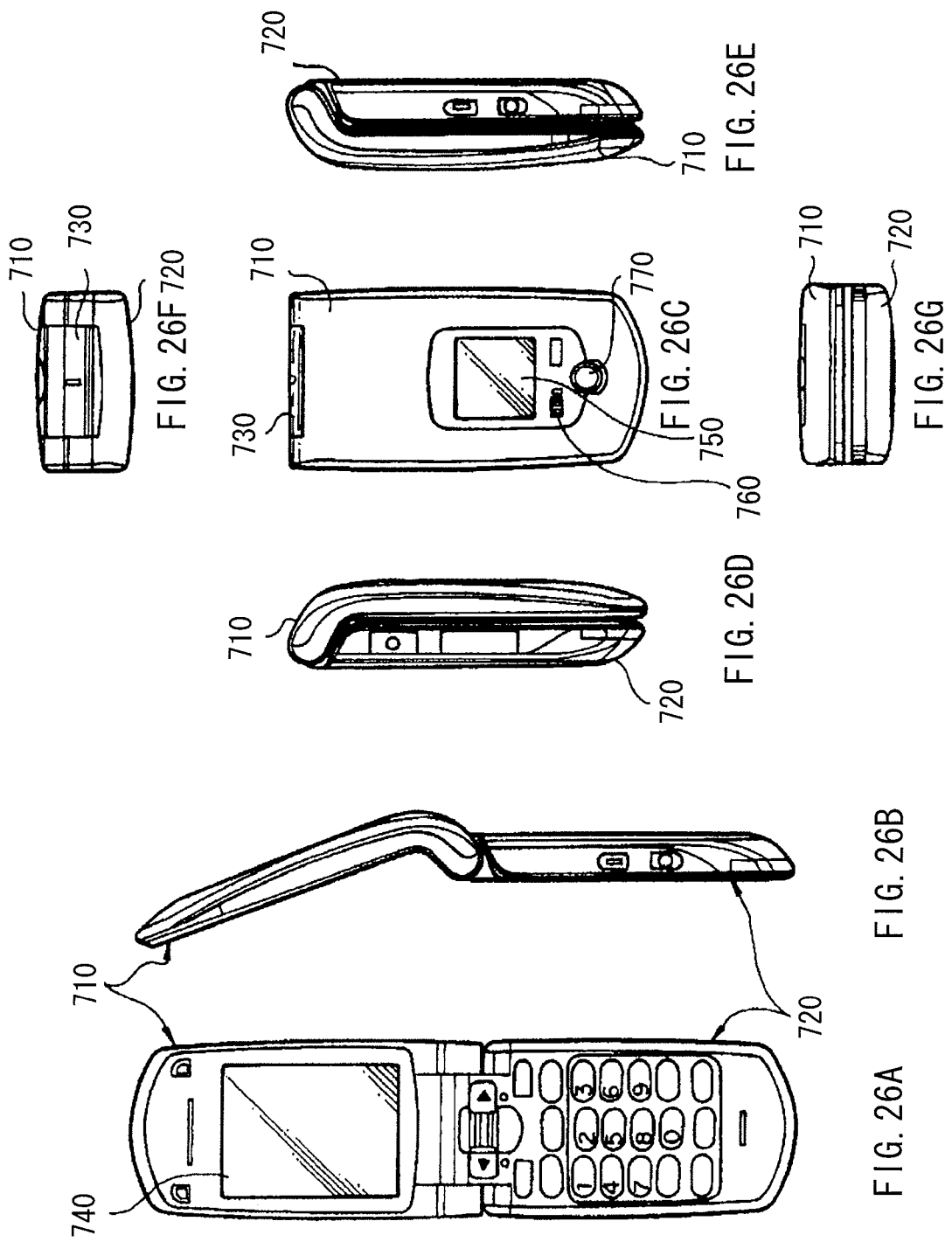

THIN FILM TRANSISTOR, DISPLAY DEVICE, AND ELECTRONIC DEVICE

BACKGROUND OF THE INVENTION

1. Field of the Invention

The present invention relates to a thin film transistor (TFT) using an oxide semiconductor layer, and a display device and an electronic device, each of which uses such a thin film transistor.

2. Description of Related Art

In a flat panel display such as a liquid crystal display or an organic EL (Electro Luminescence) display, a silicon (Si) material is typically used for a channel layer (active layer) of a driving thin-film transistor. Specifically, for example, amorphous Si or polycrystalline Si is used.

However, in the case of using amorphous Si for the channel layer, while a display is easily increased in size, since carrier (for example, electron) mobility is low, about 1 $cm^2/V*s$ or less, display performance has been hardly improved. On the other hand, in the case of using polycrystalline Si for the channel layer, while carrier mobility is high, about 30 to 300 $cm^2/V*s$, a display has been hardly increased in size due to large in-plane variation of transistor characteristics.

From these, to achieve large size and high performance of a flat panel display, a channel material, having high in-plane uniformity similar to that in the case of using amorphous Si and high carrier mobility similar to that in the case of using polycrystalline Si, has been demanded to be developed.

Thus, as a channel material that may meet such a demand, oxide semiconductor such as zinc oxide or indium-gallium-zinc oxide (InGaZnO) has been proposed, and particularly amorphous $InGaZnO_4$ is being widely investigated (for example, see Japanese Unexamined Patent Application Publication No. 2007-281409).

SUMMARY OF THE INVENTION

Such oxide semiconductor has excellent properties as a material for an active layer of a semiconductor device, and has been recently developed for application to TFT, light emitting devices, transparent conductive films and the like. For example, TFT using the oxide semiconductor as a channel layer has large carrier mobility compared with TFT using amorphous Si in the past and thus has excellent electric properties. Specifically, for example, TFT using the amorphous $InGaZnO_4$ exhibits, despite an amorphous phase, high carrier mobility, about 10 $cm^2/V*s$, compared with TFT using amorphous Si.

However, to achieve further improvement in performance of a flat panel display, further increase in carrier mobility has been demanded even for TFT using such oxide semiconductor as a channel layer.

It is desirable to provide a thin film transistor, which may be improved in carrier mobility, and provide a display device and an electronic device, each of which uses the thin film transistor.

A thin film transistor according to an embodiment of the invention includes a gate electrode, an oxide semiconductor layer including a multilayer film including a carrier travel layer configuring a channel and a carrier supply layer for supplying carriers to the carrier travel layer, a gate insulating film provided between the gate electrode and the oxide semiconductor layer, and a pair of electrodes as a source and a drain. A conduction band minimum level or a valence band maximum level corresponding to a carrier supply source of the carrier supply layer is higher in energy than a conduction band minimum level or a valence band maximum level corresponding to a carrier supply destination of the carrier travel layer.

A display device according to an embodiment of the invention includes display elements and the above-mentioned thin film transistors for driving the display elements.

An electronic device according to an embodiment of the invention includes the above-mentioned display device.

In the thin film transistor, the display device, and the electronic device according to the embodiment of the invention, the oxide semiconductor layer including a multilayer film is designed such that a conduction band minimum level or a valence band maximum level of the carrier supply layer is higher in energy than a conduction band minimum level or a valence band maximum level of the carrier travel layer. Thus, carriers are supplied from the carrier supply layer to the carrier travel layer, and the carriers are accumulated in a region near an interface with the carrier supply layer of the carrier travel layer. Therefore, when the carrier travel layer acts as a channel, carriers travel in the region substantially two-dimensionally, and therefore travel scattering to carriers is suppressed compared with in the past where carriers travel in a channel (oxide semiconductor layer) three-dimensionally. Moreover, since carriers are supplied from the carrier supply layer, carrier concentration of the carrier travel layer itself may be controlled to be low. Even in the light of this, travel scattering to carriers caused by ionized donors or acceptors is suppressed compared with in the past where an oxide semiconductor layer includes a single layer.

In the thin film transistor of the embodiment of the invention, the oxide semiconductor layer preferably has a high-resistance layer having a relatively low carrier concentration between the carrier travel layer and the carrier supply layer. In other words, the oxide semiconductor layer preferably includes a multilayer film including the carrier travel layer, the high-resistance layer, and the carrier supply layer in this order. In the case of such a configuration, when carriers are supplied from the carrier supply layer to the carrier travel layer, travel scattering to carriers caused by ionized donors or acceptors in the carrier supply layer is suppressed, leading to further improvement in carrier mobility.

According to the thin film transistor, the display device, and the electronic device of the embodiment of the invention, the oxide semiconductor layer is configured of a multilayer film including a carrier travel layer configuring a channel and a carrier supply layer, and a conduction band minimum level or a valence band maximum level of the carrier supply layer is higher in energy than a conduction band minimum level or a valence band maximum level of the carrier travel layer, therefore carriers are supplied from the carrier supply layer to the carrier travel layer, and the carriers may be accumulated in a region near an interface with the carrier supply layer of the carrier travel layer. Accordingly, travel scattering to carriers may be suppressed compared with in the past, leading to further improvement in carrier mobility.

Other and further objects, features and advantages of the invention will appear more fully from the following description.

BRIEF DESCRIPTION OF THE DRAWINGS

FIGS. 1A and 1B are section diagrams showing a configuration of TFT according to a first embodiment of the invention.

FIG. 5 is a plan diagram corresponding to a step of FIG. 4D.

FIG. 23A shows appearance of application example 2 as viewed from a surface side, and FIG. 23B shows appearance thereof as viewed from a back side.

FIGS. 26A to 26G are diagrams of application example 5, where FIG. 26A is a front diagram of the application example 5 in an opened state, FIG. 26B is a side diagram thereof, FIG. 26C is a front diagram thereof in a closed state, FIG. 26D is a left side diagram thereof, FIG. 26E is a right side diagram thereof, FIG. 26F is a top diagram thereof, and FIG. 26G is a bottom diagram thereof.

DETAILED DESCRIPTION OF THE PREFERRED EMBODIMENTS

Figure 2:
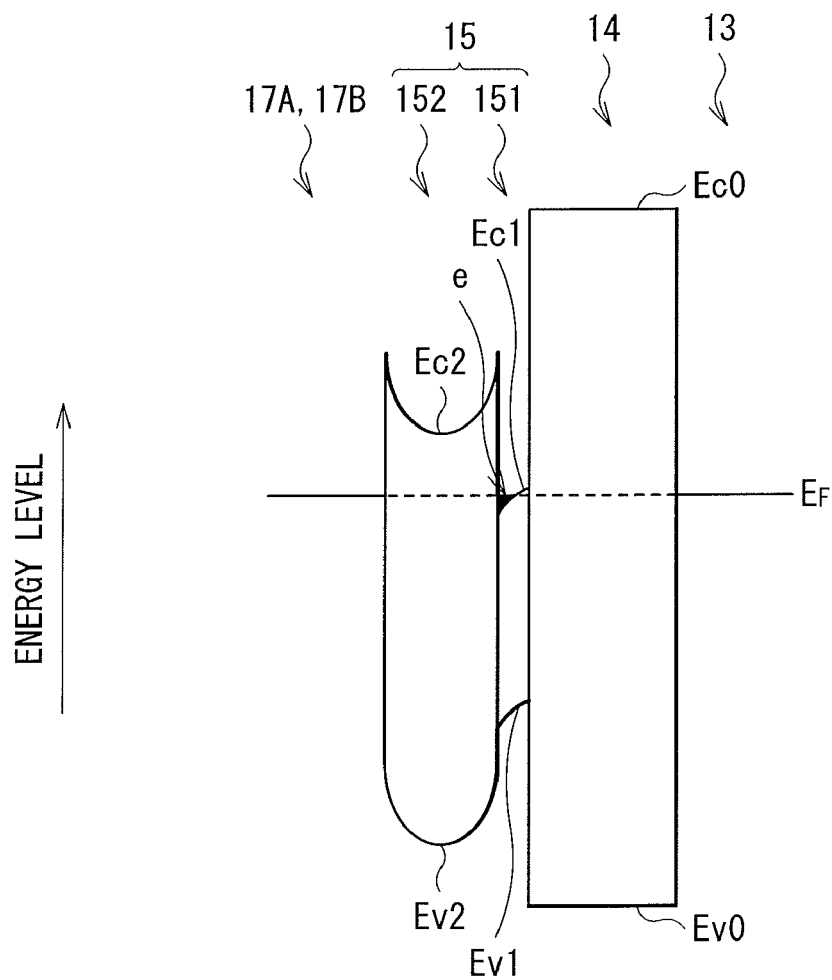
FIG. 2 is a diagram showing an example of an energy band structure of a layer structure around an oxide semiconductor layer shown in FIG. 1.

Hereinafter, preferred embodiments of the invention will be described in detail with reference to drawings. Description is made in the following sequence.

1. First embodiment (example 1 of oxide semiconductor layer with single heterostructure using electrons)
2. Modifications of first embodiment
   Modification 1 (example 2 of oxide semiconductor layer with single heterostructure using electrons)
   Modification 2 (example 1 of oxide semiconductor layer with single heterostructure using holes)
   Modification 3 (example 2 of oxide semiconductor layer with single heterostructure using holes)
3. Second embodiment (example 1 of oxide semiconductor layer with double heterostructure using electrons)
4. Modifications of second embodiment
   Modification 4 (example 2 of oxide semiconductor layer with double heterostructure using electrons)
   Modification 5 (example 1 of oxide semiconductor layer with double heterostructure using holes)
   Modification 6 (example 2 of oxide semiconductor layer with double heterostructure using holes)
5. Modification common to the embodiments and the modifications
   Modification 7 (example of top-gate TFT)
6. Application examples (application examples to display devices and electronic devices)
7. Other modifications

1. First Embodiment

General Configuration of TFT 1

FIGS. 1A and 1B show a sectional structure of a thin film transistor (TFT 1) according to a first embodiment of the invention. As shown in FIG. 1A, the TFT 1 has a gate electrode 13, a gate insulating film 14, and an oxide semiconductor layer 15 in this order on a substrate 11 with an insulating film 12 between the gate insulating film 14 and the substrate 11. That is, the TFT 1 is so-called bottom-gate (inverted stagger structure) TFT. In addition, the TFT 1 uses electrons as carriers as will be described later.

The substrate 11 is, for example, a silicon substrate. Alternatively, the substrate may include a material such as synthesized quartz, glass, metal, resin or a resin film. The insulating film 12 is configured of, for example, an insulating film material containing silicon (Si).

The gate electrode 13 controls carrier density (here, electron density) of a channel region of the oxide semiconductor layer 15 by gate voltage applied to the TFT 1. The gate electrode 13 has, for example, a two-layer structure including a molybdenum (Mo) layer about 50 nm in thickness and an aluminum (Al) layer or an aluminum alloy layer about 400 nm in thickness. The aluminum alloy layer includes, for example, an aluminum-neodymium alloy layer.

The gate insulating film 14 is configured of, for example, an insulating film material containing silicon like the insulating film 12. The gate insulating film 14, covering the gate electrode 13, is, for example, formed over the whole surface of the substrate 11 including a region over the gate electrode 13.

Sectional Configuration and Energy Band Structure of Oxide Semiconductor Layer 15

The oxide semiconductor layer 15 contains, for example, MO (M is at least one of Al, Ga, In, Zn Sn and Ti) as a major component.

The oxide semiconductor layer 15 is configured of a multilayer film (two-layer structure) including a carrier travel layer 151 and a carrier supply layer 152 sequentially stacked from the gate insulating film 14 side. In other words, the oxide semiconductor layer 15 includes a single heterostructure (SH) having one carrier supply layer 152 and one carrier travel layer 151. At least one layer of the multilayer film is preferably configured of amorphous semiconductor or polycrystalline semiconductor. For example, when amorphous InGaZnO$_4$ is used, the oxide semiconductor layer exhibits high carrier mobility value, about 10 cm$^2$/V*s, though the semiconductor has an amorphous phase.

The carrier supply layer 152 is an oxide semiconductor layer supplying carriers (here, electrons) to the carrier travel layer 151 as described below, and has a thickness of about 10 to 100 nm. Oxide semiconductor configuring the carrier supply layer 152 includes, for example, $Al_xGa_yIn_zO_{1.5x+1.5y+1.5z}$ (x, y, z: integer) or $Ga_xIn_yZn_zO_{1.5x+1.5y+z}$ (x, y, z: integer). Oxygen partial pressure is adjusted during deposition of oxide semiconductor of the carrier supply layer 152 such that carrier concentration of the oxide semiconductor is, for example, about $10^{18}$ to $10^{20}$ cm$^{-3}$, as will be described in detail later.

The carrier travel layer 151 is an oxide semiconductor layer allowing carriers (electrons) supplied from the carrier supply layer 152 to travel between source and drain electrodes 17A and 17B. That is, in the carrier travel layer 151, a channel of the TFT 1 is formed (configured) in a region near an interface with the carrier supply layer 152 of the carrier travel layer 151, and the channel has a thickness of about 10 to 100 nm. Oxide semiconductor configuring the carrier travel layer 151 includes, for example, $Al_xGa_yIn_zO_{1.5x+1.5y+1.5z}$ (x, y, z: integer), $In_2O_3$, and $Ga_xIn_yZn_zO_{1.5x+1.5y+z}$ (x, y, z: integer). Oxygen partial pressure is adjusted during deposition of oxide semiconductor of the carrier travel layer 151 such that carrier concentration of the oxide semiconductor is, for example, about $10^{14}$ to $10^{15}$ cm$^{-3}$ (a carrier concentration range of substantially intrinsic semiconductor), as will be described in detail later.

An energy band structure of such an oxide semiconductor layer 15 is described with reference to FIG. 2. FIG. 2 shows an example of an energy band structure of a layer structure (the gate electrode 13, the gate insulating film 14, the oxide semiconductor layer 15, and the source/drain electrodes 17A and 17B) around the oxide semiconductor layer 15. In the figure, $E_F$ denotes Fermi energy. Ev0, Ev1 and Ev2 denote valence band maximum levels of the gate insulating film 14, the carrier travel layer 151 and the carrier supply layer 152, respectively. Ec0, Ec1 and Ec2 denote conduction band minimum levels of the gate insulating film 14, the carrier travel layer 151 and the carrier supply layer 152, respectively. A symbol "e" schematically shows electrons as carriers. The same symbols are used in other energy band structures described hereinafter.

In the oxide semiconductor layer 15, the conduction band minimum level Ec2 corresponding to a carrier supply source of the carrier supply layer 152 is set higher in energy than the conduction band minimum level Ec1 corresponding to a carrier supply destination of the carrier travel layer 151 (Ec2>Ec1). Thus, electrons e are supplied from the carrier supply layer 152 to the carrier travel layer 151, and as shown in FIG. 2, the electrons e are accumulated in a region near an interface with the carrier supply layer 152 of the carrier travel layer 151, as will be described in detail later. While the valence band maximum level Ev2 of the carrier supply layer 152 is lower in energy than the valence band maximum level Ev1 of the carrier travel layer 151 (Ev2<Ev1) herein, any energy band structure is acceptable on a valence band side.

Figure 3:
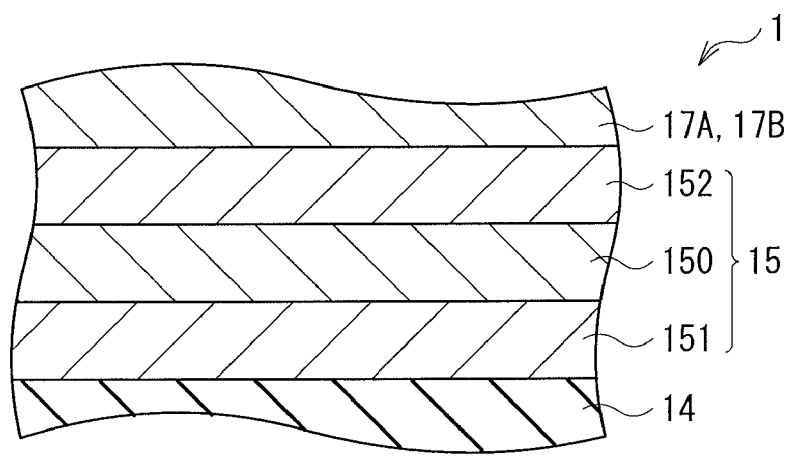
FIG. 3 is a section diagram showing another example of a detailed configuration of the oxide semiconductor layer shown in FIG. 1.

In such an oxide semiconductor layer 15, for example, as shown in FIG. 3, a high-resistance layer 150 including oxide semiconductor having relatively low carrier concentration (for example, about $10^{14}$ to $10^{16}$ cm$^{-3}$) is preferably provided between the carrier travel layer 151 and the carrier supply layer 152. In other word, the oxide semiconductor layer 15 preferably includes a multilayer film (here, three-layer structure) including the carrier travel layer 151, the high-resistance layer 150, and the carrier supply layer 152 in this order from the gate insulating film 14 side. Thus, when carriers (here, electrons) are supplied from the carrier supply layer 152 to the carrier travel layer 151, scattering to carriers caused by ionized donors in the carrier supply layer 152 is suppressed, leading to further improvement in carrier mobility, as will be described in detail later.

A channel protection film 16 including the same material as that of the insulating film 12 is provided on the oxide semiconductor layer 15 in a region opposed to the gate electrode 13. A pair of source and drain electrodes 17A and 17B (a pair of electrodes) are provided over a region from a surface of the channel protection film 16 to a surface of the oxide semiconductor layer 15. Each of the source and drain electrodes 17A and 17B is configured of a metal such as molybdenum, aluminum and titanium, or configured of a multilayer film of the metals.

A passivation film 18 including the same material as that of the insulating film 12 is provided over the channel protection film 16 and the source and drain electrodes 17A and 17B. The passivation film 18 has a pair of through-hole electrodes (contact portions) 18A and 18B in correspondence to the source and drain electrodes 17A and 17B. Thus, the source and drain electrodes 17A and 17B are electrically connected with wirings 19A and 19B via the through-hole electrodes 18A and 18B, respectively.

Method of Manufacturing TFT 1

The TFT 1 may be manufactured, for example, in the following way. FIGS. 4A to 6B are section diagrams and a plan diagram showing an example of a process of manufacturing the TFT 1.

Figures 4A, 4B, 4C, 4D:
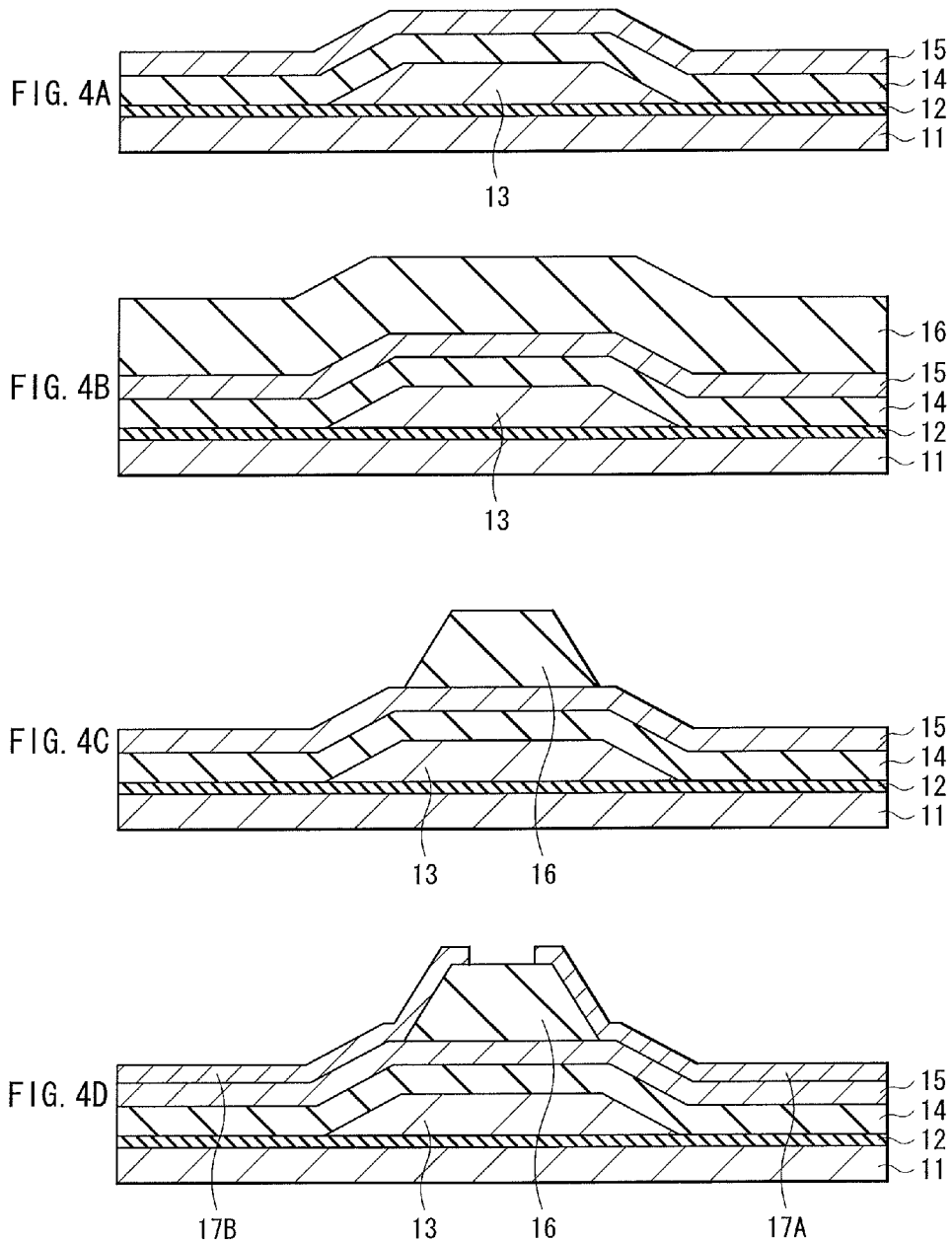
FIGS. 4A to 4D are section diagrams showing a method of manufacturing TFT shown in FIG. 1 in process sequence.

First, as shown in FIG. 4A, a SiO$_x$ (silicon oxide) layer is deposited on the substrate 11 including glass or the like by, for example, a CVD (Chemical Vapor Deposition) method so that the insulating film 12 is formed. Then, for example, a molybdenum (Mo) layer is deposited by, for example, a sputtering method, and then the gate electrode 13 is formed from the molybdenum layer by photolithography and dry etching. Next, the gate insulating film 14 is formed over the whole surface of the substrate 11 by, for example, a plasma CVD method. Then, the oxide semiconductor layer 15 is formed in a vacuum by, for example, a sputtering method (for example, DC/RF sputtering method) or a Pulsed Laser Deposition method using an oxide semiconductor target including the above-described material. In the formation of the oxide semiconductor layer 15, the carrier travel layer 151 and the carrier supply layer 152 (and the high-resistance layer 150 in some case) are formed by, for example, changing a target in a single sputter apparatus and adjusting oxygen partial pressure during deposition.

Next, as shown in FIG. 4B, a $SiO_x$ layer is deposited about 300 nm by, for example, a CVD method. Then, a resist (photosensitive resin film) is patterned by photolithography, and then the $SiO_x$ layer is dry-etched by using, for example, $C_2HF_5$ gas added with oxygen. Thus, the channel protection film 16 is formed as shown in FIG. 4C.

Next, the oxide semiconductor layer 15 is isolated for each transistor by, for example, wet etching using diluted hydrochloric acid.

Next, a resist is patterned by photolithography, and then the oxide semiconductor layer 15 is selectively removed by dry etching using, for example, chlorine gas. Then, the gate insulating film 14 is selectively removed by dry etching using, for example, $C_2HF_5$ gas added with oxygen. Thus, the gate electrode 13 is exposed in an electrode extraction portion as shown in a plan diagram of FIG. 5.

Next, as shown in FIG. 4D, a Mo layer is deposited about 100 nm by, for example, a sputtering method, and then the Mo layer is subjected to dry etching using, for example, $Cl_2CF_4$ gas added with oxygen to form the source/drain electrodes 17A and 17B.

Figure 6A:
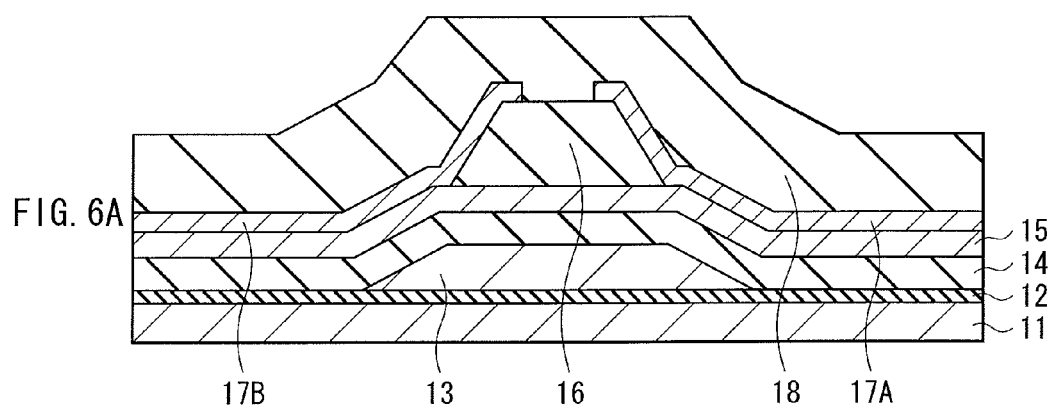
FIGS. 6A and 6B are section diagrams showing steps subsequent to the step of FIG. 5.
Figure 6B:
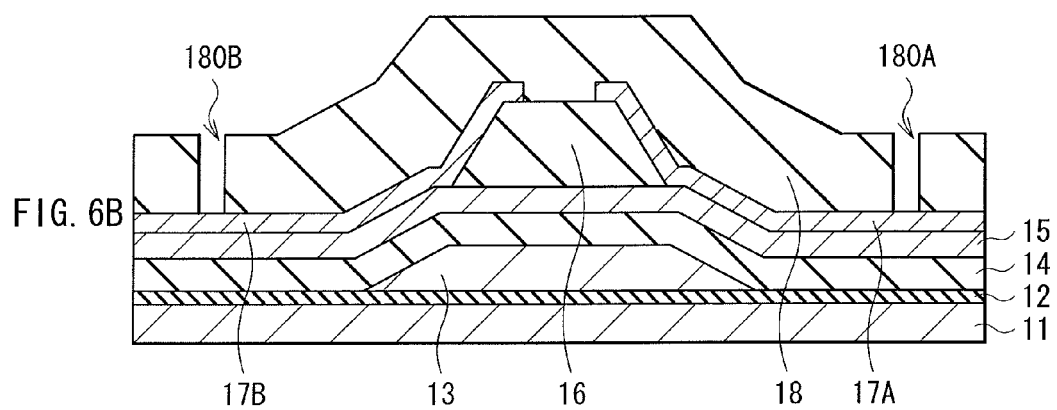
Figure 7:
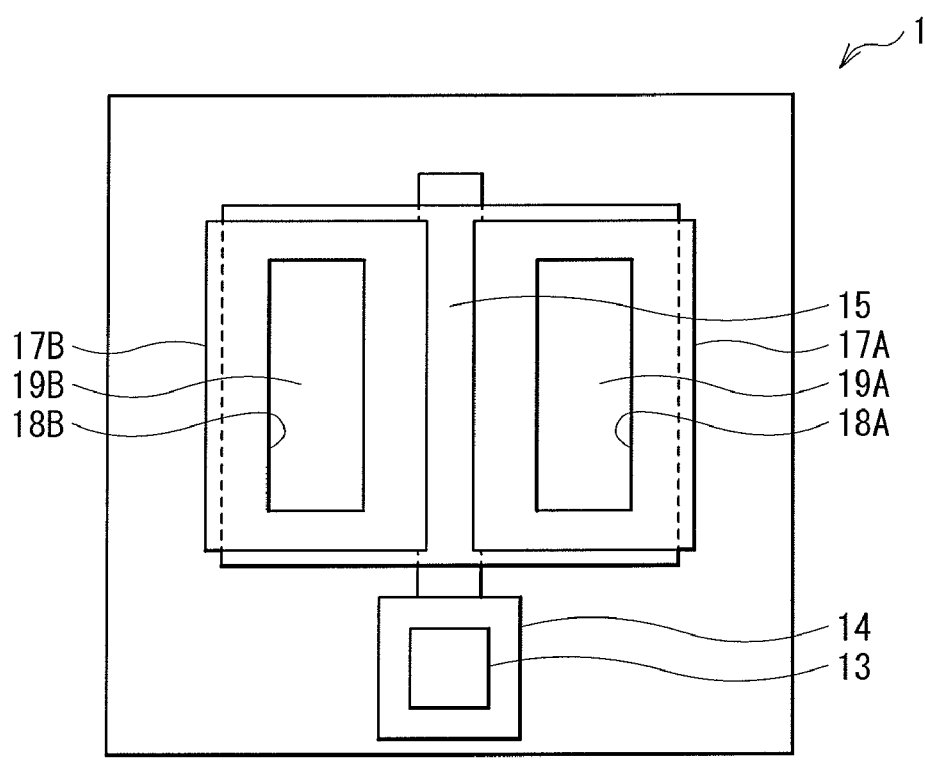
FIG. 7 is a plan diagram corresponding to the configuration of FIGS. 1A and 1B, showing a step subsequent to the steps of FIG. 6B.

Next, as shown in FIG. 6A, a SiN (silicon nitride) layer is deposited over the whole surface by a CVD method, so that the passivation film 18 is formed. Then, the passivation film 18 is selectively removed by dry etching using, for example, $C_2HF_5$ gas added with oxygen. Thus, through-holes 180A and 180B for forming the through-hole electrodes 18A and 18B are formed as shown in FIG. 6B. Then, the through-hole electrodes 18A and 18B and the wirings 19A and 19B are formed by using, for example, a sputtering method, respectively. This is the end of manufacturing of the bottom-gate TFT 1 as shown in FIG. 1 and FIG. 7 (plan diagram).

Operation and Effects of TFT 1

In the TFT 1, when a voltage (gate voltage Vg) equal to or larger than a predetermined threshold voltage Vth is applied to the gate electrode 13 via a not-shown wiring, a channel is formed in the oxide semiconductor layer 15. Thus, a current (drain current Id) flows between the source and drain electrodes 17A and 17B, so that the TFT 1 acts as a transistor.

Hereinafter, operation and effects of a featured portion of the TFT 1 of the embodiment are described in detail in comparison with a comparative example (comparative example 1) with reference to FIGS. 8 to 10.

Carrier Mobility

Figure 8:
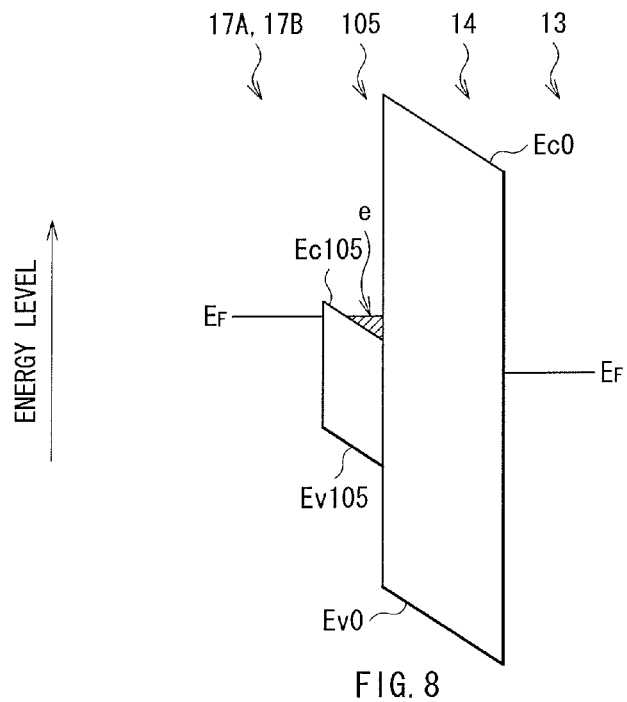
FIG. 8 is a diagram showing an energy band structure of a layer structure around an oxide semiconductor layer of TFT according to comparative example 1 when the layer structure is applied with a gate bias higher than a threshold voltage.

First, in the existing TFT according to the comparative example 1 shown in FIG. 8, an oxide semiconductor layer 105 is configured of a single layer unlike the oxide semiconductor layer 15 of the TFT 1 of the embodiment. That is, the oxide semiconductor layer 105 of the comparative example 1 as a whole acts as a channel layer, and carriers are supplied from donors in the channel layer. In FIG. 8, Ev105 and Ec105 denote a valence band maximum level and a conduction band minimum level of the oxide semiconductor layer 105, respectively.

Therefore, in the TFT of the comparative example 1, carriers (here, electrons) travel three-dimensionally in the channel layer (oxide semiconductor layer 105). That is, carriers travel not only in a two-dimensional direction along a line between the source and drain electrodes 17A and 17B but also in a thickness direction of the oxide semiconductor layer 105. Therefore, travel scattering to carriers increases, resulting in reduction in carrier mobility in the TFT of the comparative example 1. In addition, travel scattering to carriers is increased due to ionized donors in the channel layer. Even in the light of this, carrier mobility is reduced.

In contrast, in the TFT 1 of the embodiment, as shown in FIG. 1B, the oxide semiconductor layer 15 is configured of a multilayer film (two-layer structure) including the carrier supply layer 152 and the carrier travel layer 151. Moreover, for example, as shown in FIG. 2, in the oxide semiconductor layer 15, the conduction band minimum level Ec2 of the carrier supply layer 152 is higher in energy than the conduction band minimum level Ec1 of the carrier travel layer 151 (Ec2>Ec1). Thus, electrons e are supplied from the carrier supply layer 152 to the carrier travel layer 151, and as shown in FIG. 2, the electrons e are accumulated in a region near an interface with the carrier supply layer 152 of the carrier travel layer 151. In other words, in the oxide semiconductor layer 15, a supply region of the electrons e (the carrier supply layer 152) and an actual travelling region of the electrons e (the region near the interface with the carrier supply layer 152 of the carrier travel layer 151) are spatially separated along a thickness direction.

Therefore, in the TFT 1 of the embodiment, when the carrier travel layer 151 acts as a channel, the electrons e travel substantially two-dimensionally in the region near the interface. That is, unlike the comparative example 1, the electrons e travel substantially only in a two-dimensional direction along a line between the source and drain electrodes 17A and 17B (the electrons e hardly travel along a thickness direction of the oxide semiconductor layer 15). Consequently, in the TFT 1, travel scattering to electrons e is suppressed compared with in the comparative example 1 where carriers travel three-dimensionally in the channel layer (the oxide semiconductor layer 105).

In the TFT 1 of the embodiment, since electrons e are supplied from the carrier supply layer 152 as described before, carrier concentration of the carrier travel layer 151 itself may be controlled to be low (for example, the carrier concentration may be approximately made in a concentration range of intrinsic semiconductor). Therefore, donor concentration may be set extremely low in a region where carriers actually travel. Even in the light of this, in the TFT 1, travel scattering to electrons e caused by ionized donor is suppressed compared with in the comparative example 1 where the oxide semiconductor layer 105 is a single layer.

Figure 9:
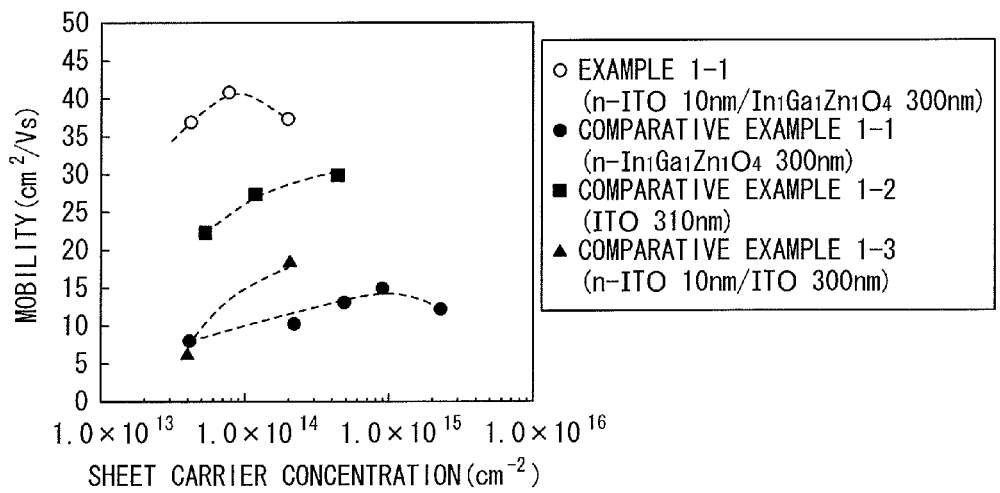
FIG. 9 is a characteristic diagram showing a relationship between carrier concentration and carrier mobility in each of example 1 according to the first embodiment and the comparative example 1.

FIG. 9 shows an example of relationships between carrier concentration (sheet carrier concentration) and carrier mobility of example 1-1 according to the embodiment and comparative examples 1-1 to 1-3 according to the comparative example 1. A single-layer structure of carrier-supply n-$Ga_1In_1Zn_1O_4$ (thickness: 300 nm) is used for the oxide semiconductor layer 105 of the comparative example 1-1, a single-layer structure of ITO (Indium Tin Oxide) (thickness: 310 nm) is used for the oxide semiconductor layer 105 of the comparative example 1-2, and a single-layer structure of ITO being partially supplied with carriers (n-ITO (thickness: 10 nm)/ITO (thickness: 300 nm)) is used for the oxide semiconductor layer 105 of the comparative example 1-3. In the oxide semiconductor layer 15 having a single heterostructure of the example 1-1, $Ga_1In_1Zn_1O_4$ (thickness: 300 nm) is used for the carrier travel layer 151, and n-ITO (thickness: 10 nm) is used for the carrier supply layer 152. In each case, the oxide semiconductor layer is deposited by a sputtering method, and carrier (electron) mobility is obtained through Hall measurement.

From FIG. 9, it is understood that high electron mobility is exhibited in the example 1-1 compared with in the comparative examples 1-1 to 1-3. From this, it is confirmed that travel scattering to electrons are suppressed in the embodiment (example 1-1) compared with in the comparative example 1 (comparative examples 1-1 to 1-3) as described before, as a result, electron mobility is improved in the embodiment. In example 1-2 (not shown in FIG. 9), a high-resistance layer 150 is provided between the carrier travel layer 151 and the carrier supply layer 152, and thickness of the high-resistance layer 150 is optimized, and electron mobility is thus improved compared with in the comparative example 1 (comparative examples 1-1 to 1-3).

Oxygen Partial Pressure During Deposition of Oxide Semiconductor Layer

The embodiment has the following advantage compared with the comparative example 1 even in controlling oxygen partial pressure during deposition of the oxide semiconductor layer 15.

First, generally, in TFT using an oxide semiconductor layer, oxygen partial pressure is controlled during deposition of the oxide semiconductor layer so as to adjust the amount of oxygen deficiency, thereby carrier concentration is controlled to have a desired value (value within a range in which an operation specification of a transistor is satisfied) as described before.

Figure 10:
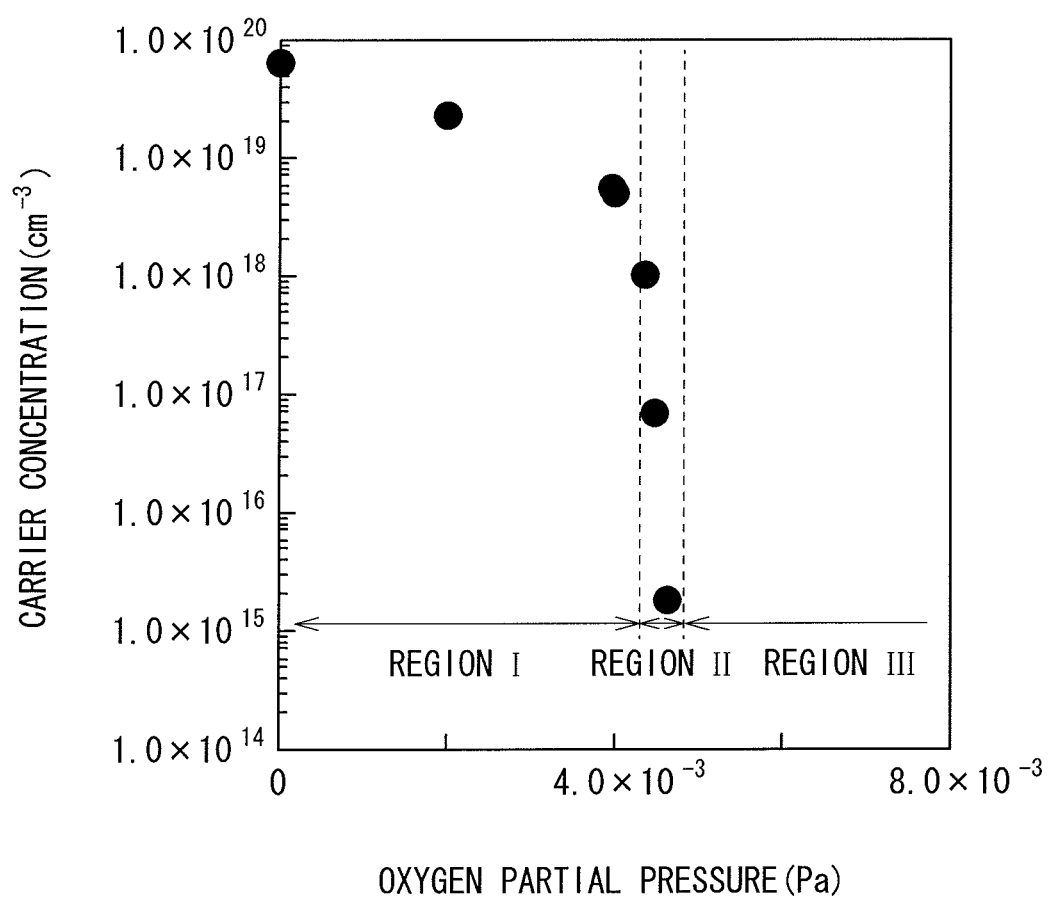
FIG. 10 is a characteristic diagram showing an example of a relationship between oxygen partial pressure during deposition of the oxide semiconductor layer and carrier concentration thereof.

FIG. 10 shows an example of a relationship between oxygen partial pressure during deposition of an oxide semiconductor layer and carrier (electron) concentration of the layer. Here, amorphous $Ga_1In_1Zn_1O_4$ is used for the oxide semiconductor layer, and a DC sputtering method (deposition temperature: 80° C.) is used for deposition of the layer.

As shown in FIG. 10, to achieve an oxide semiconductor layer having a desired carrier concentration (for example, about $10^{15}$ to $10^{18}$ $cm^{-3}$), oxygen partial pressure during deposition of the layer needs to be controlled to be in an extremely narrow region II. However, since variation of a carrier concentration value to change in oxygen partial pressure value is extremely large (dependence of carrier concentration on oxygen partial pressure is extremely large) in the region II, accurate carrier concentration control through control of oxygen partial pressure is extremely difficult in the comparative example 1 (related art). Therefore, in the TFT of the comparative example 1 (TFT using an oxide semiconductor layer having a single layer structure), a transistor characteristic is increased in in-plane variation on a substrate surface or variation for each manufacturing lot, as a result, a manufacturing yield is hardly improved.

In the TFT 1 of the embodiment, as described before, the oxide semiconductor layer 15 is designed such that a supply region of electrons e (the carrier supply layer 152) and an actual travelling region of electrons e (the region near the interface of the carrier travel layer 151) are spatially separated along a thickness direction. That is, since the electrons are supplied from the carrier supply layer 152, carrier concentration of the carrier travel layer 151 itself may be controlled to be low (for example, the carrier concentration may be adjusted to be approximately in a concentration range of intrinsic semiconductor).

Thus, to achieve a desired carrier concentration (for example, about $10^{15}$ to $10^{18}$ $cm^{-3}$) of the carrier travel layer 151, oxygen partial pressure in a region III in FIG. 10 may be used as oxygen partial pressure of the carrier travel layer 151 itself during deposition of the layer 151. That is, accurate control of oxygen partial pressure is unnecessary in deposition of the carrier travel layer 151 unlike the comparative example 1.

Regarding the carrier supply layer 152, to achieve the desired carrier concentration of the carrier travel layer 151, for example, oxygen partial pressure in a region I (an oxygen partial pressure region in which carrier concentration is above the desired range) in FIG. 10 may be used as oxygen partial pressure during deposition of the carrier supply layer 152. Therefore, since variation of a carrier concentration value to change in oxygen partial pressure value is small (dependence of carrier concentration on oxygen partial pressure is small) in the region I compared with in the region II, accurate control of oxygen partial pressure is unnecessary unlike the comparative example 1 even in deposition of the carrier supply layer 152. Desired carrier concentration of the oxide semiconductor layer 15 as a whole is controlled by a plurality of parameters including not only doping amount of donor-like or acceptor-like impurities adjusted by such oxygen partial pressure control but also thickness of an impurity doping region or a distance from a semiconductor interface.

In this way, in the TFT 1 of the embodiment, since accurate control of oxygen partial pressure is unnecessary during deposition of the oxide semiconductor layer 15 unlike in the comparative example 1, variation in transistor characteristic (in-plane variation on a substrate surface or variation for each manufacturing lot) may be suppressed compared with in the comparative example 1.

As described hereinbefore, in the embodiment, the oxide semiconductor layer 15 is configured of a multilayer film including the carrier travel layer 151 and the carrier supply layer 152, and the conduction band minimum level Ec2 of the carrier supply layer 152 is higher in energy than the conduction band minimum level Ec1 of the carrier travel layer 151, and therefore carriers (electrons) are supplied from the carrier supply layer 152 to the carrier travel layer 151, and the electrons may be accumulated in a region near an interface with the carrier supply layer 152 of the carrier travel layer 151. Consequently, travel scattering to electrons may be suppressed compared with in the past, leading to improvement in electron mobility. Moreover, since electron mobility may be improved, driving capability of the TFT 1 as a transistor may be improved.

When the high-resistance layer 150 is provided between the carrier travel layer 151 and the carrier supply layer 152, and thickness of the high-resistance layer 150 is optimized, scattering to electrons caused by ionized donors in the carrier supply layer 152 may be suppressed during supplying electrons from the carrier supply layer 152 to the carrier travel layer 151, leading to further improvement in electron mobility.

Furthermore, carrier concentration of the oxide semiconductor layer 15 as a whole may be controlled by a position or thickness of the carrier supply layer 152, donor or acceptor concentration and the like, accurate control of oxygen partial pressure is unnecessary unlike in the single-layer channel structure in the past. Consequently, variation in transistor characteristic (in-plane variation on a substrate surface or variation for each manufacturing lot) may be suppressed compared with in the past, leading to improvement in manufacturing yield.

In addition, when the oxide semiconductor layer 15 having such a multilayer film structure is formed, for example, since it is only necessary that a target is changed in a single sputter apparatus (with oxygen partial pressure during deposition being adjusted), a manufacturing process is not significantly different from a manufacturing process of an oxide semiconductor layer having a single-layer structure in the past, and consequently increase in manufacturing cost may be minimized.

2. Modifications of First Embodiment

Next, modifications (modifications 1 to 3) of the first embodiment will be described. The same components as in the first embodiment are marked with the same reference numerals or signs, and description of them is appropriately omitted.

Modification 1

Figure 11A:
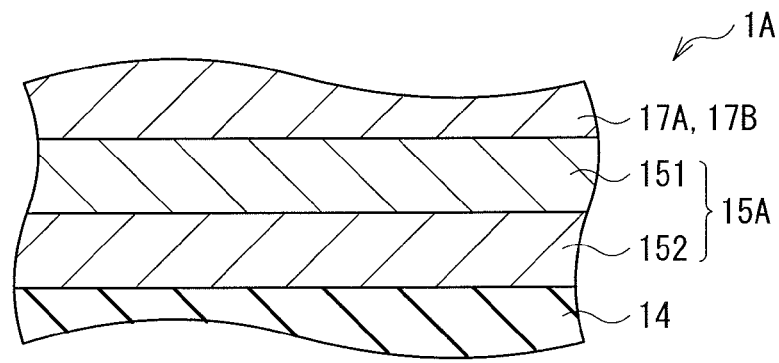
FIGS. 11A and 11B are diagrams showing a detailed, sectional configuration of an oxide semiconductor layer of TFT according to modification 1, and an example of an energy band structure of a layer structure around the oxide semiconductor layer, respectively.
Figure 11B:
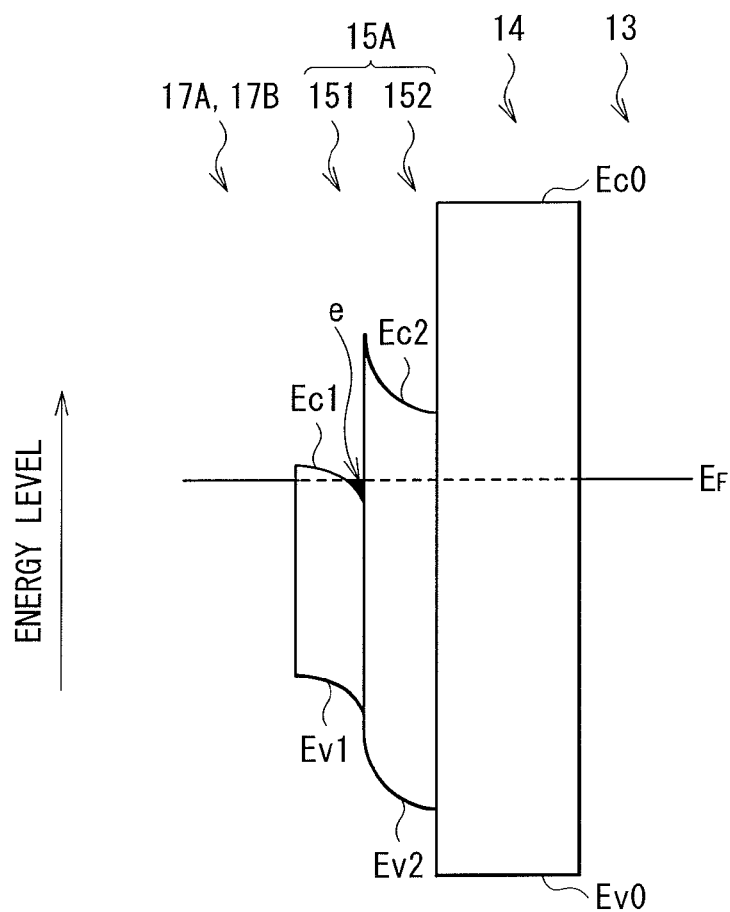

FIG. 11A shows a sectional configuration of an oxide semiconductor layer 15A of a thin film transistor (TFT 1A) according to modification 1, and FIG. 11B shows an example of an energy band structure of a layer structure around the oxide semiconductor layer 15A.

As shown in FIGS. 11A and 11B, the TFT 1A of the modification corresponds to TFT having the same configuration as that of the TFT 1 of the first embodiment except that a stacking order of the carrier travel layer 151 and the carrier supply layer 152 in the oxide semiconductor layer 15 is reversed. That is, the oxide semiconductor layer 15A of the modification is configured of a multilayer film (two-layer structure) including the carrier supply layer 152 and the carrier travel layer 151 sequentially stacked from the gate insulating film 14 side. In other words, the oxide semiconductor layer 15A includes a single heterostructure having one carrier supply layer 152 and one carrier travel layer 151 like the oxide semiconductor layer 15.

As shown in FIG. 11B, even in the TFT 1A, the conduction band minimum level Ec2 of the carrier supply layer 152 is set higher in energy than the conduction band minimum level Ec1 of the carrier travel layer 151 (Ec2>Ec1) as in the TFT 1. Even in this case, any energy band structure is acceptable on a valence band side.

According to such a configuration, even in the modification, the same operation and thus the same effects as in the first embodiment may be obtained. Even in the modification, it is preferable that a high-resistance layer 150 is provided between the carrier travel layer 151 and the carrier supply layer 152, and thickness of the high-resistance layer 150 is optimized as in the first embodiment.

Modification 2

Figure 12A:
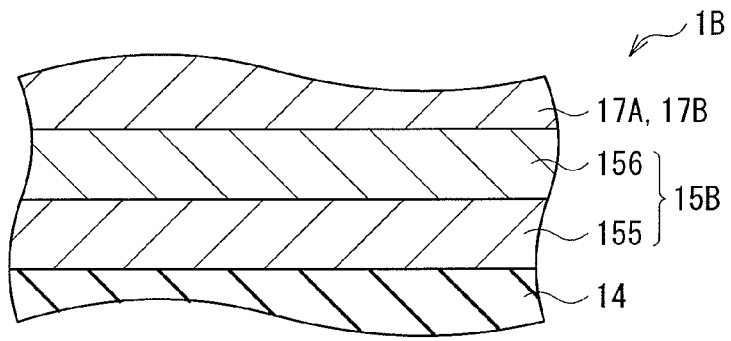
FIGS. 12A and 12B are diagrams showing a detailed, sectional configuration of an oxide semiconductor layer of TFT according to modification 2, and an example of an energy band structure of a layer structure around the oxide semiconductor layer, respectively.
Figure 12B:
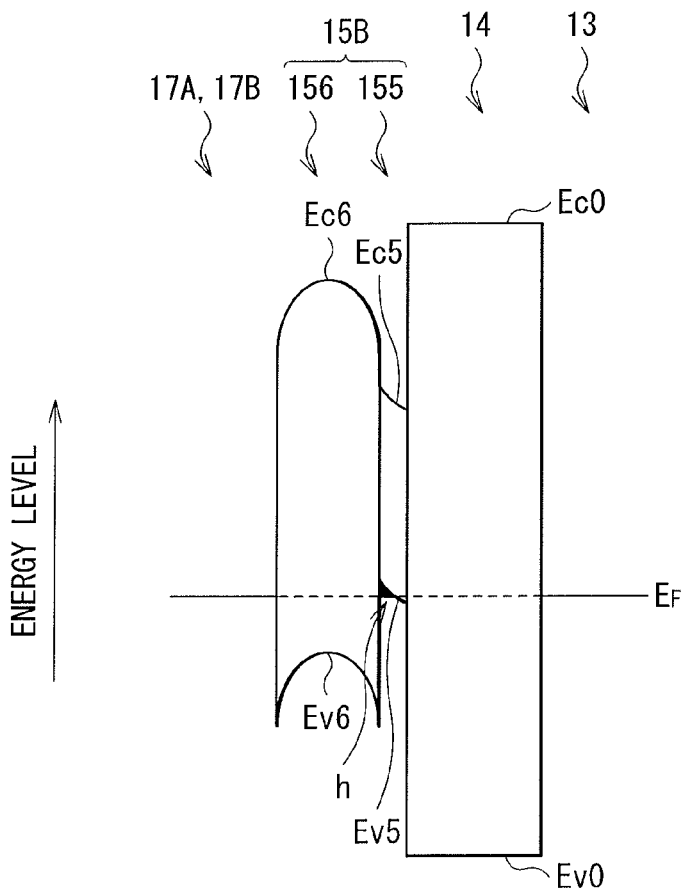

FIG. 12A shows a sectional configuration of an oxide semiconductor layer 15B of a thin film transistor (TFT 1B) according to modification 2, and FIG. 12B shows an example of an energy band structure of a layer structure around the oxide semiconductor layer 15B.

The TFT 1B of the modification uses holes as carriers unlike the first embodiment and the modification 1. Specifically, as shown in FIGS. 12A and 12B, the TFT 1B corresponds to the TFT having the same configuration as that of the TFT 1 of the first embodiment except that an oxide semiconductor layer 15B using holes as carriers is provided in place of the oxide semiconductor layer 15 using electrons as carriers.

The oxide semiconductor layer 15B is configured of a multilayer film (two-layer structure) including the carrier travel layer 155 and a carrier supply layer 156 sequentially stacked from a gate insulating film 14 side. In other words, the oxide semiconductor layer 15B includes a single heterostructure having one carrier supply layer 156 and one carrier travel layer 155 like the oxide semiconductor layer 15.

The carrier supply layer 156 is an oxide semiconductor layer supplying carriers (here, holes) to the carrier travel layer 155. Oxide semiconductor configuring the carrier supply layer 156 includes, for example, $Al_xCu_yO_{1.5x+0.5y}$ (x, y: integer).

The carrier travel layer 155 is an oxide semiconductor layer allowing carriers (holes) supplied from the carrier supply layer 156 to travel between source and drain electrodes 17A and 17B. That is, in the carrier travel layer 155, a channel of the TFT 1B is formed (configured) in a region near an interface with the carrier supply layer 156 of the carrier travel layer 155 as in the carrier travel layer 151. Oxide semiconductor configuring such a carrier travel layer 155 includes, for example, $Cu_2O$ or $NiO$.

As shown in FIG. 12B, in the oxide semiconductor layer 15B, valence band maximum level Ev6 corresponding to a carrier supply source of the carrier supply layer 156 is set higher in energy than valence band maximum level Ev5 corresponding to a carrier supply destination of the carrier travel layer 155 (Ev6>Ev5). In this case, any energy band structure is acceptable on a conduction band side. In the figure, a symbol "h" schematically denotes holes as carriers.

According to such a configuration, in the TFT 1B of the modification, carriers (holes h) are supplied from the carrier supply layer 156 to the carrier travel layer 155, and the holes h are accumulated in a region near an interface with the carrier supply layer 156 of the carrier travel layer 155. In other words, in the oxide semiconductor layer 15B, a supply region of holes h (the carrier supply layer 156) and an actual travelling region of holes h (the region near the interface with the carrier supply layer 156 of the carrier travel layer 155) are spatially separated along a thickness direction.

Therefore, even in the modification, the same operation and thus the same effects as in the first embodiment may be obtained. That is, travel scattering to holes may be suppressed compared with in the past, leading to improvement in hole mobility. Moreover, since hole mobility may be improved, driving capability of the TFT 1B as a transistor may be improved.

Even in the modification, it is preferable that a high-resistance layer 150 is provided between the carrier travel layer 155 and the carrier supply layer 156, and thickness of the high-resistance layer 150 is optimized as in the first embodiment. Thus, when holes are supplied from the carrier supply layer 156 to the carrier travel layer 155, scattering to holes caused by ionized acceptors in the carrier supply layer 156 may be suppressed, leading to further improvement in hole mobility.

Modification 3

Figure 13A:
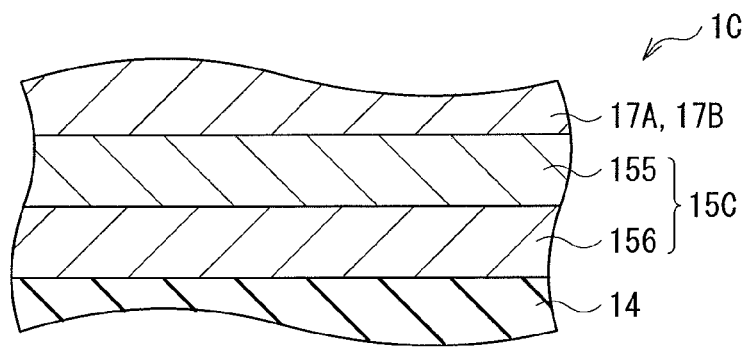
FIGS. 13A and 13B are diagrams showing a detailed, sectional configuration of an oxide semiconductor layer of TFT according to modification 3, and an example of an energy band structure of a layer structure around the oxide semiconductor layer, respectively.
Figure 13B:
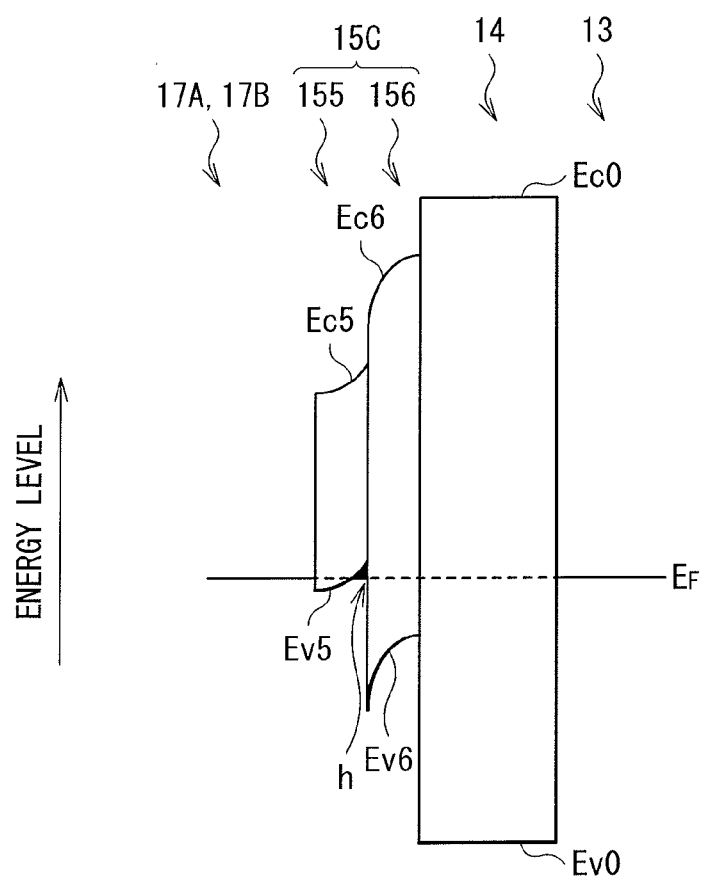

FIG. 13A shows a sectional configuration of an oxide semiconductor layer 15C of a thin film transistor (TFT 1C) according to modification 3, and FIG. 13B shows an example of an energy band structure of a layer structure around the oxide semiconductor layer 15C.

As shown in FIGS. 13A and 13B, the TFT 1C of the modification corresponds to TFT having the same configuration as that of the TFT 1B of the modification 2 except that a stacking order of the carrier travel layer 155 and the carrier supply layer 156 in the oxide semiconductor layer 15B is reversed. That is, the oxide semiconductor layer 15C of the modification also uses holes as carriers, and is configured of a multilayer film (two-layer structure) including the carrier supply layer 156 and the carrier travel layer 155 sequentially stacked from the gate insulating film 14 side. In other words, the oxide semiconductor layer 15C includes a single heterostructure having one carrier supply layer 156 and one carrier travel layer 155 like the oxide semiconductor layer 15.

As shown in FIG. 13B, even in the TFT 1C, valence band maximum level Ev6 of the carrier supply layer 156 is set higher in energy than valence band maximum level Ev5 of the carrier travel layer 155 (Ev6>Ev5) as in the TFT 1B. Even in this case, any energy band structure is acceptable on a conduction band side.

According to such a configuration, even in the modification, the same operation and thus the same effects as in the modification 2 may be obtained. Even in the modification, it is preferable that a high-resistance layer 150 is provided between the carrier travel layer 155 and the carrier supply layer 156, and thickness of the high-resistance layer 150 is optimized as in the modification 2.

3. Second Embodiment

Next, a second embodiment of the invention will be described. The same components as in the first embodiment or the modifications 1 to 3 are marked with the same reference numerals or signs, and description of them is appropriately omitted.

Figure 14A:
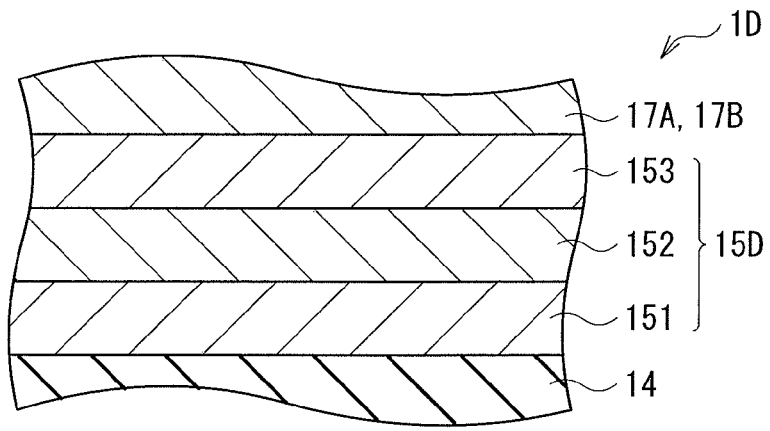
FIGS. 14A and 14B are diagrams showing a detailed, sectional configuration of an oxide semiconductor layer of TFT according to a second embodiment, and an example of an energy band structure of a layer structure around the oxide semiconductor layer, respectively.
Figure 14B:
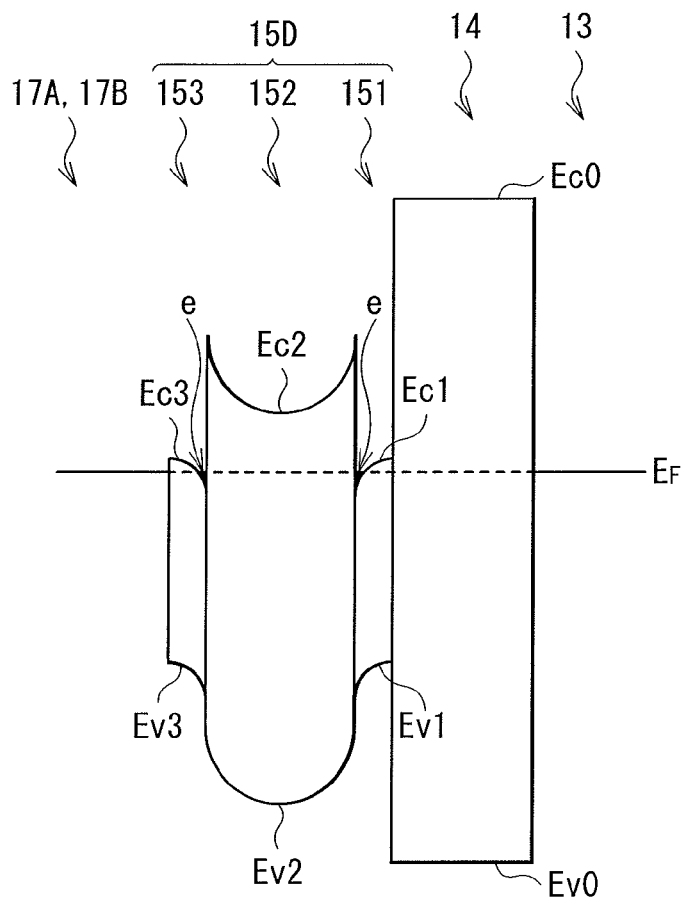

FIG. 14A shows a sectional configuration of an oxide semiconductor layer 15D of a thin film transistor (TFT 1D) according to the embodiment, and FIG. 14B shows an example of an energy band structure of a layer structure around the oxide semiconductor layer 15D.

As shown in FIGS. 14A and 14B, the TFT 1D of the embodiment has the oxide semiconductor layer 15D using a double heterostructure (DH) unlike the first embodiment and the modifications 1 to 3 (single heterostructure). Specifically, the oxide semiconductor layer 15D includes a double heterostructure having a pair of carrier travel layers 151 and 153 on a top and a bottom of one carrier supply layer 152. That is, the oxide semiconductor layer 15D is configured of a multilayer film (three-layer structure) including the carrier travel layer 151, the carrier supply layer 152, and the carrier travel layer 153 sequentially stacked from the gate insulating film 14 side.

The carrier supply layer 152 is an oxide semiconductor layer supplying carriers (here, electrons) to the carrier travel layers 151 and 153. Oxide semiconductor configuring the carrier supply layer 152 includes, for example, $Al_xGa_yIn_zO_{1.5x+1.5y+1.5z}$ (x, y, z: integer) or $Ga_xIn_yZn_zO_{1.5x+1.5y+z}$ (x, y, z: integer).

As shown in FIG. 14B, in the oxide semiconductor layer 15D, conduction band minimum level Ec2 of the carrier supply layer 152 is higher in energy than conduction band minimum level Ec1 of the carrier travel layer 151 or conduction band minimum level Ec3 of the carrier travel layer 153 (Ec2>Ec1 or Ec3). However, each of the conduction band minimum levels Ec1 and Ec3 may be higher than the other, or the levels may be equal to each other. Even in this case, any energy band structure is acceptable on a valence band side.

According to such a configuration, in the TFT 1D of the embodiment, electrons e are supplied from the carrier supply layer 152 to the carrier travel layers 151 and 153, respectively. Thus, as shown in FIG. 14B, electrons e are accumulated in a region near an interface with the carrier supply layer 152 of the carrier travel layer 151, and accumulated in a region near an interface with the carrier supply layer 152 of the carrier travel layer 153. In other words, in the oxide semiconductor layer 15D, a supply region of electrons e (the carrier supply layer 152) and an actual travelling region of electrons e (the region near the interface with the carrier supply layer 152 of the carrier travel layer 151 or 153) are spatially separated along a thickness direction.

Thus, even in the embodiment, the same operation and thus the same effects as in the first embodiment may be obtained. That is, travel scattering to electrons may be suppressed compared with in the past, leading to improvement in electron mobility.

Even in the embodiment, it is preferable that a high-resistance layer 150 is provided between the carrier travel layer 151 and the carrier supply layer 152 or between the carrier travel layer 153 and the carrier supply layer 152, and thickness of the high-resistance layer 150 is optimized as in the first embodiment.

4. Modifications of Second Embodiment

Next, modifications (modifications 4 to 6) of the second embodiment will be described. The same components as in the second embodiment are marked with the same reference numerals or signs, and description of them is appropriately omitted.

Modification 4

Figure 15A:
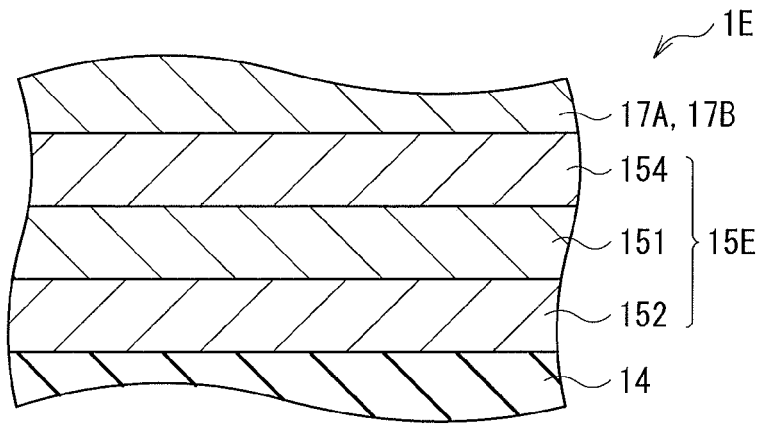
FIGS. 15A and 15B are diagrams showing a detailed, sectional configuration of an oxide semiconductor layer of TFT according to modification 4, and an example of an energy band structure of a layer structure around the oxide semiconductor layer, respectively.
Figure 15B:
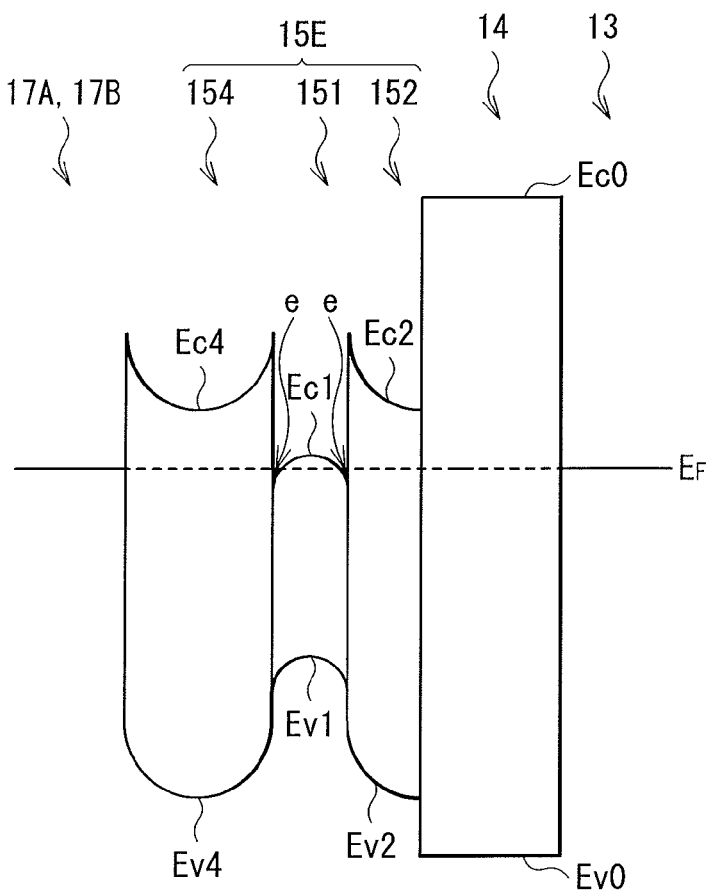

FIG. 15A shows a sectional configuration of an oxide semiconductor layer 15E of a thin film transistor (TFT 1E) according to modification 4, and FIG. 15B shows an example of an energy band structure of a layer structure around the oxide semiconductor layer 15E.

As shown in FIGS. 15A and 15B, the TFT 1E of the modification has an oxide semiconductor layer (the oxide semiconductor layer 15E) using a double heterostructure like the TFT 1D of the second embodiment. That is, TFT 1E corresponds to TFT having the same configuration as that of the TFT 1D except that the oxide semiconductor layer 15E is provided in place of the oxide semiconductor layer 15D.

However, the oxide semiconductor layer 15E of the modification uses a double heterostructure having a configuration different from that of the oxide semiconductor layer 15D in the second embodiment. Specifically, the oxide semiconductor layer 15E includes a double heterostructure having a pair of carrier supply layers 152 and 154 on a top and a bottom of one carrier travel layer 151. That is, the oxide semiconductor layer 15E is configured of a multilayer film (three-layer structure) including the carrier supply layer 152, the carrier travel layer 151, and the carrier supply layer 154 sequentially stacked from the gate insulating film 14 side.

The carrier travel layer 151 is an oxide semiconductor layer allowing carriers (electrons) supplied from the carrier supply layer 152 or 154 to travel between source and drain electrodes 17A and 17B. That is, in the carrier travel layer 151, a channel of the TFT 1E is formed (configured) in a region, being near an interface with each of the carrier supply layers 152 and 154, of the carrier travel layer 151. Oxide semiconductor configuring such a carrier travel layer 151 includes, for example, $Al_xGa_yIn_zO_{1.5x+1.5y+1.5z}$ (x, y, z: integer), $In_2O_3$, or $Ga_xIn_yZn_zO_{1.5x+1.5y+z}$ (x, y, z: integer).

As shown in FIG. 15B, in the oxide semiconductor layer 15E, conduction band minimum levels Ec2 and Ec4 of the carrier supply layers 152 and 154 are higher in energy than conduction band minimum level Ec1 of the carrier travel layer 151 (Ec2 or Ec4>Ec1). However, each of the conduction band minimum levels Ec2 and Ec4 may be higher than the other, or the levels may be equal to each other. Even in this case, any energy band structure is acceptable on a valence band side.

According to such a configuration, in the TFT 1E of the modification, electrons e are supplied from the carrier supply layer 152 or 154 to the carrier travel layer 151. Thus, as shown in FIG. 15B, electrons e are accumulated in a region near the interface with the carrier supply layer 152 and in a region near the interface with the carrier supply layer 154 of the carrier travel layer 151, respectively. In other words, in the oxide semiconductor layer 15E, a supply region of electrons e (the carrier supply layer 152 or 154) and an actual travelling region of electrons e (the region, being near the interface with each of the carrier supply layers 152 and 154, of the carrier travel layer 151) are spatially separated along a thickness direction.

Therefore, even in the modification, the same operation and thus the same effects as in the second embodiment may be obtained. Even in the modification, it is preferable that a high-resistance layer 150 is provided between the carrier travel layer 151 and the carrier supply layer 152 or between the carrier travel layer 151 and the carrier supply layer 154, and thickness of the high-resistance layer 150 is optimized as in the first embodiment.

Modification 5

Figure 16A:
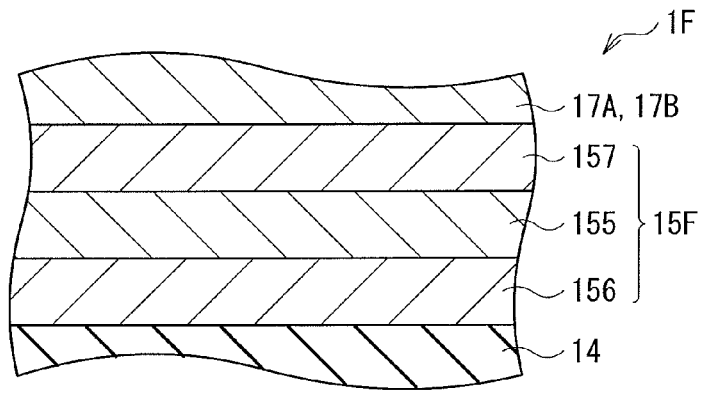
FIGS. 16A and 16B are diagrams showing a detailed, sectional configuration of an oxide semiconductor layer of TFT according to modification 5, and an example of an energy band structure of a layer structure around the oxide semiconductor layer, respectively.
Figure 16B:
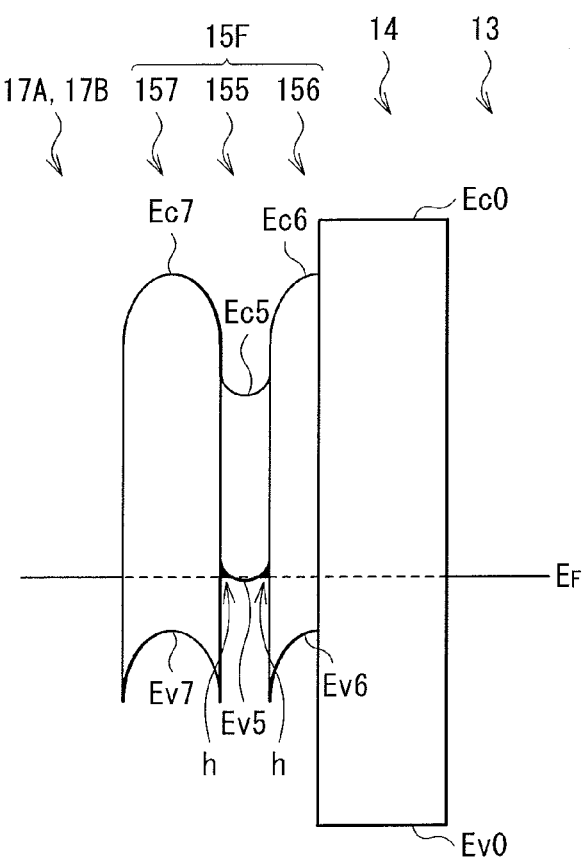

FIG. 16A shows a sectional configuration of an oxide semiconductor layer 15F of a thin film transistor (TFT 1F) according to modification 5, and FIG. 16B shows an example of an energy band structure of a layer structure around the oxide semiconductor layer 15F.

The TFT 1F of the modification uses holes as carriers unlike the second embodiment and the modification 4. Specifically, as shown in FIGS. 16A and 16B, the TFT 1F corresponds to TFT having the same configuration as that of the TFT 1D of the second embodiment except that the oxide semiconductor layer 15F using holes as carriers is provided in place of the oxide semiconductor layer 15D using electrons as carriers.

The oxide semiconductor layer 15F is configured of a multilayer film (three-layer structure) including a carrier supply layer 156, a carrier travel layer 155, and a carrier supply layer 157 sequentially stacked from the gate insulating film 14 side. That is, the oxide semiconductor layer 15F includes a double heterostructure having a pair of carrier supply layers 156 and 157 on a top and a bottom of one carrier travel layer 155 like the oxide semiconductor layer 15D.

The carrier supply layer 157 or 156 is an oxide semiconductor layer supplying carriers (here, holes) to the carrier travel layer 155. Oxide semiconductor configuring the carrier supply layer 157 includes, for example, $Al_xCu_yO_{1.5x+0.5}$ (x, y: integer).

As shown in FIG. 16B, in the oxide semiconductor layer 15F, each of valence band maximum levels Ev6 and Ev7 of the carrier supply layers 156 and 157 is higher in energy than valence band maximum level Ev5 of the carrier travel layer 155 (Ev6 or Ev7>Ev5). However, each of the valence band maximum levels Ev6 and Ev7 may be higher than the other, or the levels may be equal to each other. Even in this case, any energy band structure is acceptable on a conduction band side.

According to such a configuration, in the TFT 1F of the modification, holes h are supplied from the carrier supply layer 156 or 157 to the carrier travel layer 155, respectively. Thus, as shown in FIG. 16B, holes h are accumulated in a region, being near an interface with each of the carrier supply layers 156 and 157, of the carrier travel layer 155. In other words, in the oxide semiconductor layer 15F, a supply region of holes h (the carrier supply layer 156 or 157) and an actual travelling region of holes h (the region near the interface with the carrier supply layer 156 or 157 of the carrier travel layer 155) are spatially separated along a thickness direction.

Therefore, even in the modification, the same operation and thus the same effects as in the second embodiment may be obtained. That is, travel scattering to holes may be suppressed compared with in the past, leading to improvement in hole mobility.

Even in the modification, it is preferable that a high-resistance layer 150 is provided between the carrier travel layer 155 and the carrier supply layer 156 or between the carrier travel layer 155 and the carrier supply layer 157, and thickness of the high-resistance layer 150 is optimized as in the first embodiment.

Modification 6

Figure 17A:
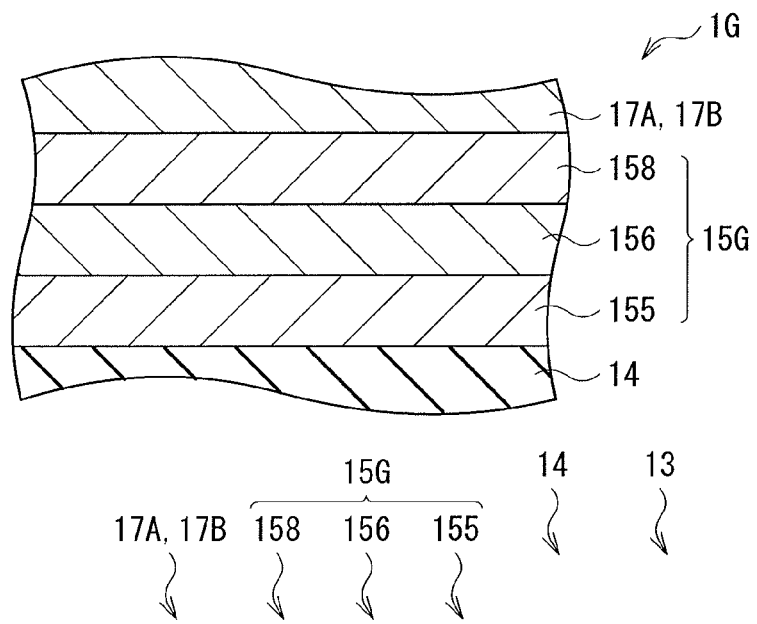
FIGS. 17A and 17B are diagrams showing a detailed, sectional configuration of an oxide semiconductor layer of TFT according to modification 6, and an example of an energy band structure of a layer structure around the oxide semiconductor layer, respectively.
Figure 17B:
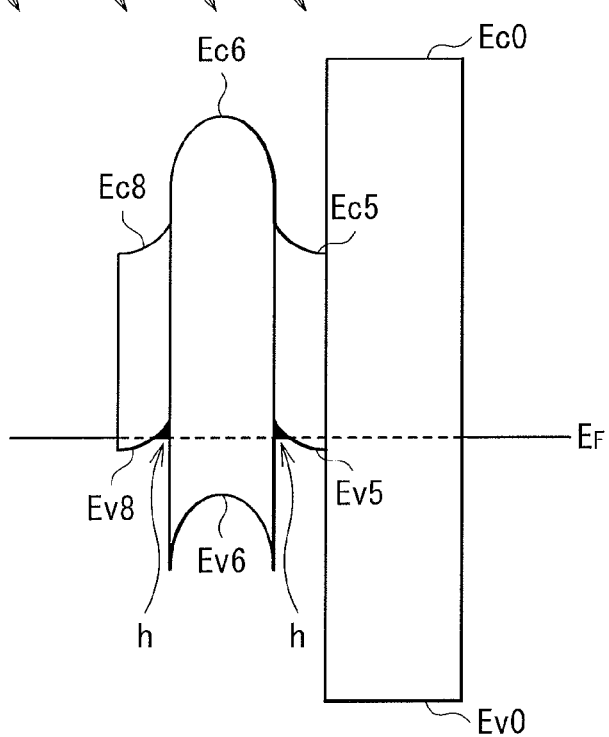

FIG. 17A shows a sectional configuration of an oxide semiconductor layer 15G of a thin film transistor (TFT 1G) according to modification 6, and FIG. 17B shows an example of an energy band structure of a layer structure around the oxide semiconductor layer 15G.

As shown in FIGS. 17A and 17B, the TFT 1G of the modification uses holes as carriers, and has an oxide semiconductor layer (the oxide semiconductor layer 15G) using a double heterostructure, like the TFT 1F of the modification 5. That is, TFT 1G corresponds to TFT having the same configuration as that of the TFT 1F except that the oxide semiconductor layer 15G is provided in place of the oxide semiconductor layer 15F.

However, the oxide semiconductor layer 15G of the modification uses a double heterostructure having a configuration different from that of the oxide semiconductor layer 15F in the modification 5. Specifically, the oxide semiconductor layer 15G includes a double heterostructure having a pair of carrier travel layers 155 and 158 on a top and a bottom of one carrier supply layer 156. That is, the oxide semiconductor layer 15G is configured of a multilayer film (three-layer structure) including a carrier travel layer 155, a carrier supply layer 156, and a carrier travel layer 158 sequentially stacked from the gate insulating film 14 side.

The carrier travel layer 158 or 155 is an oxide semiconductor layer allowing carriers (holes) supplied from the carrier supply layer 156 to travel between source and drain electrodes 17A and 17B. That is, in the carrier travel layer 158 or 155, a channel of the TFT 1G is formed (configured) in a region near an interface with the carrier supply layer 156 of the carrier travel layer 158 or 155. Oxide semiconductor configuring such a carrier travel layer 158 includes, for example, $Cu_2O$ or NiO.

As shown in FIG. 17B, in the oxide semiconductor layer 15G, valence band maximum level Ev6 of the carrier supply layer 156 is higher in energy than valence band maximum level Ev5 of the carrier travel layer 155 and valence band maximum level Ev8 of the carrier travel layer 158 (Ev6>Ev5 or Ev8). However, each of the valence band maximum levels Ev5 and Ev8 may be higher than the other, or may be equal to each other. Even in this case, any energy band structure is acceptable on a conduction band side.

According to such a configuration, in the TFT 1G of the modification, holes h are supplied from the carrier supply layer 156 to the carrier travel layers 155 and 158, respectively. Thus, as shown in FIG. 17B, holes h are accumulated in a region near an interface with the carrier supply layer 156 of the carrier travel layer 155, and accumulated in a region near an interface with the carrier supply layer 156 of the carrier travel layer 158. In other words, in the oxide semiconductor layer 15G, a supply region of holes h (the carrier supply layer 156) and an actual travelling region of holes h (the region near the interface with the carrier supply layer 156 of the carrier travel layer 155 or 158) are spatially separated along a thickness direction.

Therefore, even in the modification, the same operation and thus the same effects as in the second embodiment may be obtained. That is, travel scattering to holes may be suppressed compared with in the past, leading to improvement in hole mobility.

Even in the modification, it is preferable that a high-resistance layer 150 is provided between the carrier travel layer 155 and the carrier supply layer 156 or between the carrier travel layer 158 and the carrier supply layer 156, and thickness of the high-resistance layer 150 is optimized as in the first embodiment.

5. Modification Common to the Embodiments and the Modifications

Next, a modification (modification 7) common to the first and second embodiments and the modifications 1 to 6 described hereinbefore will be described. The same components as in the embodiments and the like are marked with the same reference numerals or signs, and description of them is appropriately omitted.

Modification 7

Figure 18:
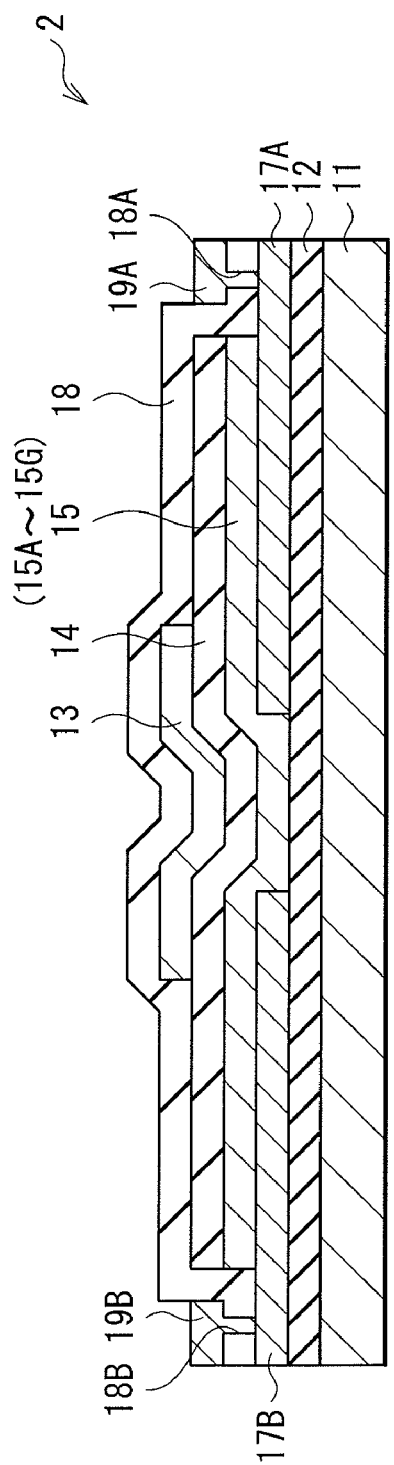
FIG. 18 is a section diagram showing a configuration of TFT according to modification 7.

FIG. 18 shows a sectional configuration of a thin film transistor (TFT 2) according to modification 7. The TFT 2 has an oxide semiconductor layer 15 (or oxide semiconductor layers 15A to 15G), a gate insulating film 14, and a gate electrode 13 in this order on a substrate 11 with an insulating film 12 between the oxide semiconductor layer 15 and the substrate 11. That is, the TFT 2 of the modification is so-called top-gate (stagger structure) TFT unlike the bottom-gate (inverted stagger structure) TFT as described hereinbefore.

In this way, an embodiment of the invention may be applied not only to the bottom-gate TFT but also to the top-gate TFT. Therefore, even in the modification, the same operation and thus the same effects as in the embodiments and the like may be obtained.

6. Application Examples

Next, application examples of the thin film transistors (TFT 1, TFT 1A to TFT 1G, and TFT 2) according to the first and second embodiments and the modifications 1 to 7 to display devices and electronic devices will be described.

Application Example to Display Device

Figure 19:
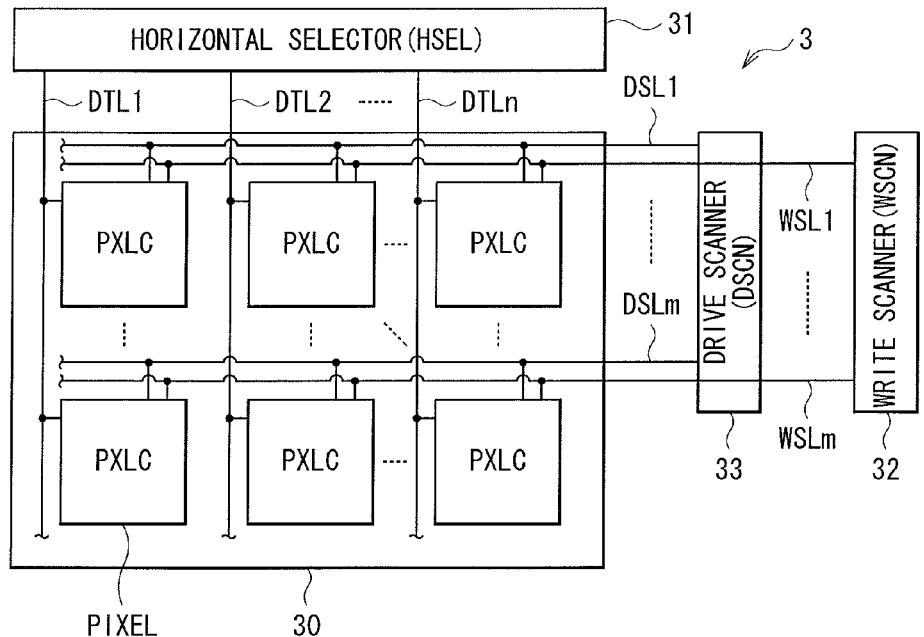
FIG. 19 is a block diagram showing a configuration example of a display device having TFT according to each of the embodiments and the modifications.

FIG. 19 shows a configuration example of a display device used as an organic EL display (display device 3 including organic EL elements). For example, the display device 3 has a display region 30, in which a plurality of pixels PXLC including organic EL elements (organic field emission elements) as display elements are arranged in a matrix, on a TFT substrate (the substrate 11). A horizontal selector (HSEL) 31 as a signal line drive circuit, a write scanner (WSCN) 32 as a scan line drive circuit, and a drive scanner (DSCN) 33 as a power line drive circuit are provided in the periphery of the display region 30.

In the display region 30, a plurality of (a whole number n) signal lines DTL1 to DTLn are arranged in a column direction, and a plurality of (a whole number m) scan lines WSL1 to WSLm and a plurality of (a whole number m) power lines DSL1 to DSLm are arranged in a row direction, respectively. Each pixel PXLC (one of pixels corresponding to red (R), green (G) and blue (B)) is provided at an intersection between each signal line DTL and each scan line WSL. Each signal line DTL is connected to the horizontal selector 31 and thus supplied with a video signal from the horizontal selector 31. Each scan line WSL is connected to the write scanner 32 and thus supplied with a scan signal (selection pulse) from the write scanner 32. Each power line DSL is connected to the drive scanner 33 and thus supplied with a power signal (control pulse) from the drive scanner 33.

Figure 20:
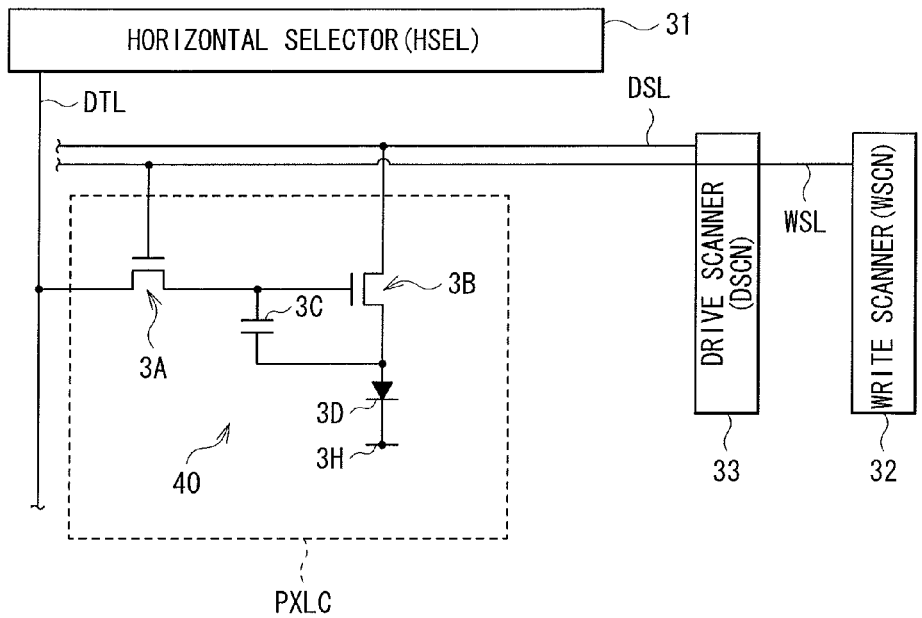
FIG. 20 is a circuit diagram showing a detailed configuration example of a pixel shown in FIG. 19.

FIG. 20 shows an example of a circuit configuration of the pixel PXLC. Each pixel PXLC has a pixel circuit 40 including an organic EL element 3D. The pixel circuit 40 is an active drive circuit having a sampling transistor 3A, a drive transistor 3B, a capacitive element 3C, and the organic EL element 3D. The transistor 3A or 3B is configured of one of the thin film transistors (TFT 1, TFT 1A to TFT 1G, and TFT 2) of the embodiments and the like.

In the sampling transistor 3A, a gate thereof is connected to a corresponding scan line WSL, one of a source and a drain thereof is connected to a corresponding signal line DTL, and the other is connected to a gate of the drive transistor 3B. In the drive transistor 3B, a drain of the transistor is connected to a corresponding power line DSL, and a source thereof is connected to an anode of the organic EL element 3D. A cathode of the organic EL element 3D is connected to a ground line 3H. The ground line 3H is commonly wired to all the pixels PXLC. The capacitive element 3C is disposed between the source and gate of the drive transistor 3B.

The sampling transistor 3A becomes conductive in response to a scan signal (selection pulse) supplied through the scan line WSL and thus samples signal potential of a video signal supplied through the signal line DTL so that the signal potential is held in the capacitive element 3C. The drive transistor 3B is supplied with a current through a power line DSL set to a predetermined first potential (not shown), and supplies a drive current to the organic EL element 3D in correspondence to the signal potential held in the capacitive element 3C. The organic EL element 3D is supplied with the drive current from the drive transistor 3B, and thus emits light with luminance in correspondence to signal potential of a video signal.

In the display device 3, the sampling transistor 3A becomes conductive in response to a scan signal (selection pulse) supplied through the scan line WSL, thereby signal potential of a video signal supplied through the signal line DTL is sampled and held in the capacitive element 3C. A current is supplied to the drive transistor 3B through the power line DSL set to the first potential, and a drive current is supplied to the organic EL element 3D (respective organic EL elements of red, green and blue) in correspondence to the signal potential held in the capacitive element 3C. Each organic EL element 3D is supplied with the drive current and thus emits light with luminance in correspondence to signal potential of a video signal. Thus, the display device 3 displays a video image based on a video signal.

Application Examples to Electronic Devices

Next, application examples of the display device to electronic devices will be described. The display device may be applied to electronic devices in any field, such as a television apparatus, a digital camera, a notebook personal computer, a mobile terminal such as mobile phone, or a video camera. In other words, the display device may be applied to electronic devices in any field for displaying a still or moving image based on an externally-inputted or internally-generated video signal.

Module

Figure 21:
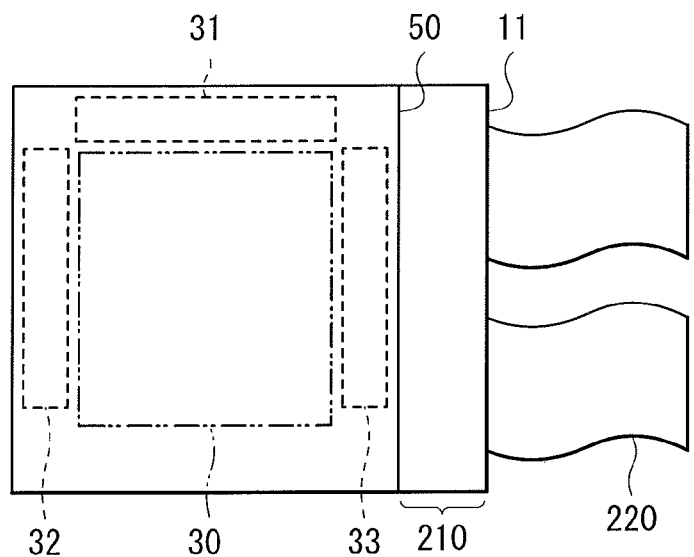
FIG. 21 is a plan diagram showing a schematic configuration of a module including the display device shown in FIG. 19.

The display device may be built in various electronic devices such as application examples 1 to 5 described later, for example, in a form of a module shown in FIG. 21. In the module, for example, a region 210 exposed from a sealing substrate 50 is provided in one side of a substrate 11, and external connection terminals (not shown) are formed in the exposed region 210 by extending lines of a horizontal selector 31, a write scanner 32, and a drive scanner 33. The external connection terminals may be attached with a flexible printed circuit (FPC) 220 for input or output of signals.

Application Example 1

Figure 22:
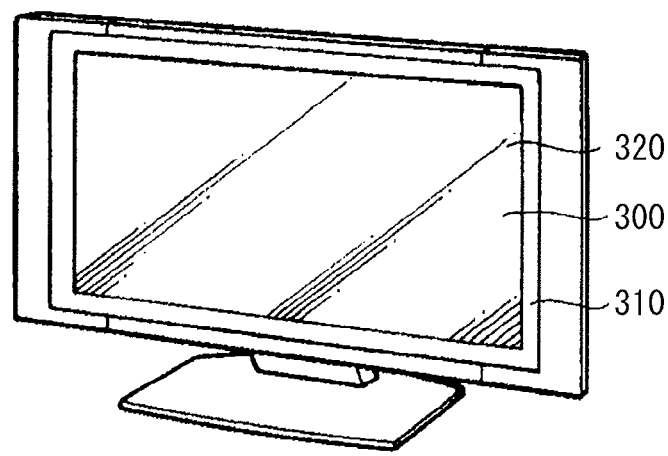
FIG. 22 is a perspective diagram showing appearance of application example 1 of the display device shown in FIG. 19.

FIG. 22 shows appearance of a television apparatus using the display device. The television apparatus has, for example, an image display screen 300 including a front panel 310 and filter glass 320, and the image display screen 300 is configured of the display device.

Application Example 2

Figure 23A:
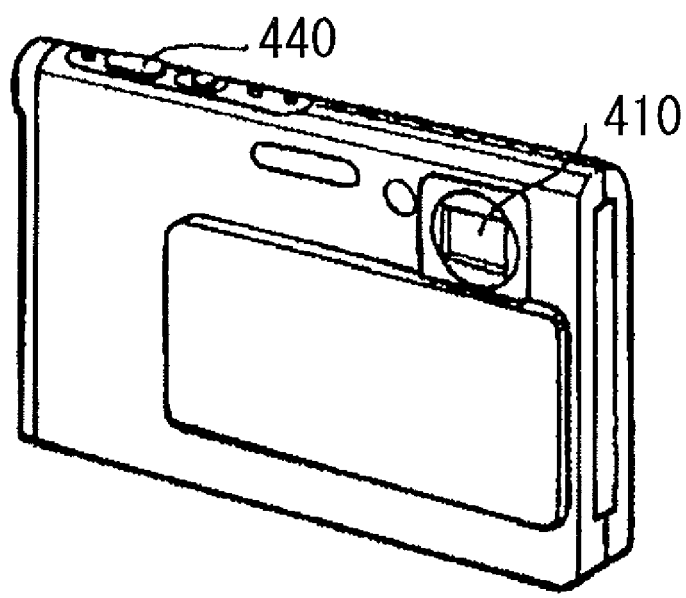
FIGS. 23A and 23B are perspective diagrams, where
Figure 23B:
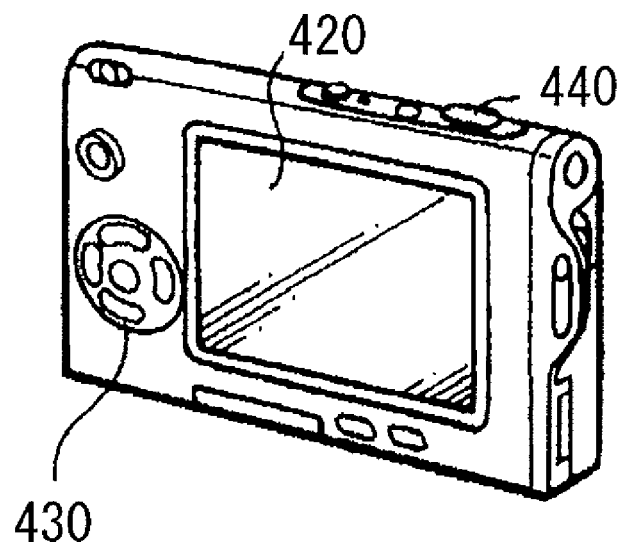

FIGS. 23A and 23B show appearance of a digital camera using the display device. The digital camera has, for example, a light emitting section for flash 410, a display 420, a menu switch 430 and a shutter button 440, and the display 420 is configured of the display device.

Application Example 3

Figure 24:
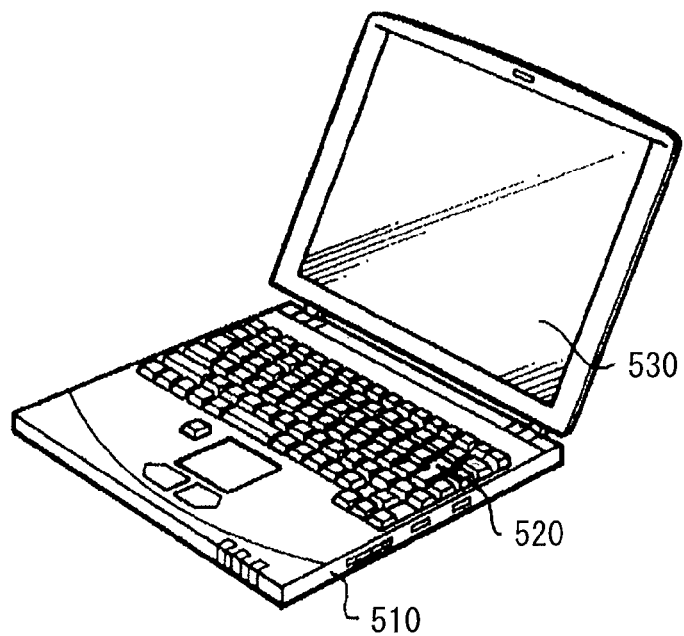
FIG. 24 is a perspective diagram showing appearance of application example 3.

FIG. 24 shows appearance of a notebook personal computer using the display device. The notebook personal computer has, for example, a body 510, a keyboard 520 for input operation of letters and the like, and a display 530 for displaying images, and the display 530 is configured of the display device.

Application Example 4

Figure 25:
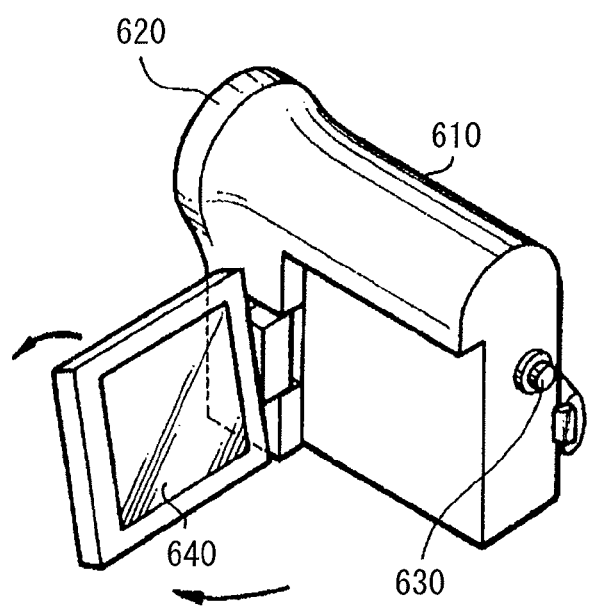
FIG. 25 is a perspective diagram showing appearance of application example 4.

FIG. 25 shows appearance of a video camera using the display device. The video camera has, for example, a body 610, an object-shooting lens 620 provided on a front side-face of the body 610, a start/stop switch 630 for shooting, and a display 640. The display 640 is configured of the display device.

Application Example 5

FIGS. 26A to 26G show appearance of a mobile phone using the display device. For example, the mobile phone is assembled by connecting an upper housing 710 to a lower housing 720 by a hinge 730, and has a display 740, a sub display 750, a picture light 760, and a camera 770. The display 740 or the sub display 750 is configured of the display device.

7. Other Modifications

While the invention has been described with the embodiments, the modifications, and the application examples hereinbefore, the invention is not limited to the embodiments and the like, and may be variously modified or altered.

For example, in the above application examples, application examples of the thin film transistor of an embodiment of the invention to a display device have been described with a display device (organic EL display device) including organic EL elements. However, this is not limitative. That is, the thin film transistor of an embodiment of the invention may be applied to various types of display devices other than the organic EL display device (for example, a liquid crystal display device including liquid crystal elements as display elements or an LED display device including light emitting diodes (LED) as display elements).

In addition, material and thickness of each layer or a deposition method and deposition condition thereof described in the embodiments and the like are not limitative, and another material and another thickness or another deposition method and another deposition condition may be used.

The present application contains subject matter related to that disclosed in Japanese Priority Patent Application JP 2009-298103 filed in the Japan Patent Office on Dec. 28, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalent thereof.

What is claimed is:

1. A thin film transistor comprising:
 a gate electrode;
 an oxide semiconductor layer including a multilayer film, the multiplayer film including a carrier travel layer acting as a channel and a carrier supply layer for supplying carriers to the carrier travel layer;
 a gate insulating film provided between the gate electrode and the oxide semiconductor layer; and
 a pair of electrodes acting as a source and a drain respectively,
 wherein,
  the carrier supply layer has a higher conduction band minimum energy level than that of the carrier travel layer, or
  the carrier supply layer has a higher valence band maximum energy level than that of the carrier travel layer.

2. The thin film transistor according to claim 1, wherein the oxide semiconductor layer includes a high-resistance layer between the carrier travel layer and the carrier supply layer, the high-resistance layer having a relatively low carrier concentration.

3. The thin film transistor according to claim 1, wherein the oxide semiconductor layer includes a single heterostructure, the single heterostructure having the carrier travel layer and the carrier supply layer, each layer being a single layer.

4. The thin film transistor according to claim 1, wherein the oxide semiconductor layer includes a double heterostructure, the double heterostructure having a pair of carrier supply layers on a top and a bottom of one carrier travel layer, respectively.

5. The thin film transistor according to claim 1, wherein the oxide semiconductor layer includes a double heterostructure, the double heterostructure having a pair of carrier travel layers on a top and a bottom of one carrier supply layer, respectively.

6. The thin film transistor according to claim 1, wherein:
the carriers are electrons, and
a conduction band minimum level of the carrier supply layer is higher in energy than a conduction band minimum level of the carrier travel layer.

7. The thin film transistor according to claim 1, wherein:
the carriers are holes, and
the carrier supply layer has a higher valence band maximum energy level than that of the carrier travel layer.

8. The thin film transistor according to claim 1, wherein the carrier supply layer comprises $Al_x Ga_y In_z O_{1.5x+1.5y+1.5z}$ (x, y, z: integer).

9. The thin film transistor according to claim 8, wherein the carrier travel layer comprises $Al_x Ga_y In_z O_{1.5x+1.5y+1.5z}$ (x, y, z: integer).

10. The thin film transistor according to claim 1, wherein at least one layer of the multilayer film of the oxide semiconductor layer comprises amorphous semiconductor.

11. The thin film transistor according to claim 1, wherein at least one layer of the multilayer film of the oxide semiconductor layer comprises polycrystalline semiconductor.

12. The thin film transistor according to claim 1, wherein the gate electrode is between the gate insulating film and a substrate.

13. The thin film transistor according to claim 1, wherein the oxide semiconductor layer is between the gate insulating film and a substrate.

14. The thin film transistor of claim 1, wherein the carrier travel layer comprises amorphous semiconductor.

15. The thin film transistor of claim 1, wherein the carrier supply layer comprises amorphous semiconductor.

16. The thin film transistor of claim 1, wherein the carrier travel layer comprises polycrystalline semiconductor.

17. The thin film transistor of claim 1, wherein the carrier supply layer comprises polycrystalline semiconductor.

* * * * *